USD10163468B2

(12) United States Patent
Hinton et al.

(10) Patent No.: US 10,163,468 B2
(45) Date of Patent: *Dec. 25, 2018

(54) MULTIPLE REGISTER MEMORY ACCESS INSTRUCTIONS, PROCESSORS, METHODS, AND SYSTEMS

(71) Applicant: Intel Corporation, Santa Clara, CA (US)

(72) Inventors: Glenn Hinton, Portland, OR (US); Bret Toll, Hillsboro, OR (US); Ronak Singhal, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/855,618

(22) Filed: Dec. 27, 2017

(65) Prior Publication Data

US 2018/0122432 A1 May 3, 2018

Related U.S. Application Data

(63) Continuation of application No. 15/728,293, filed on Oct. 9, 2017, which is a continuation of application
(Continued)

(51) Int. Cl.
*G06F 9/30* (2018.01)
*G11C 7/10* (2006.01)

(52) U.S. Cl.
CPC ........ *G11C 7/1036* (2013.01); *G06F 9/30043* (2013.01); *G06F 9/30109* (2013.01); *G06F 9/30163* (2013.01)

(58) Field of Classification Search
None
See application file for complete search history.

(56) References Cited

U.S. PATENT DOCUMENTS 5,913,054 A 6/1999 Mallick et al.
5,944,811 A 8/1999 Motomura
(Continued)

FOREIGN PATENT DOCUMENTS

CN 1890630 A 1/2007
JP 10-228376 A 8/1998
(Continued)

OTHER PUBLICATIONS

Office Action received for Korean Patent Application No. 10-2015-7031473, dated Aug. 31, 2017, 7 pages of Korean Office Action including 3 pages of English Translation.
(Continued)

*Primary Examiner* — Cheng-Yuan Tseng
(74) *Attorney, Agent, or Firm* — Nicholson De Vos Webster & Elliot LLP

(57) ABSTRACT

A processor includes N-bit registers and a decode unit to receive a multiple register memory access instruction. The multiple register memory access instruction is to indicate a memory location and a register. The processor includes a memory access unit coupled with the decode unit and with the N-bit registers. The memory access unit is to perform a multiple register memory access operation in response to the multiple register memory access instruction. The operation is to involve N-bit data, in each of the N-bit registers comprising the indicated register. The operation is also to involve different corresponding N-bit portions of an M×N-bit line of memory corresponding to the indicated memory location. A total number of bits of the N-bit data in the N-bit registers to be involved in the multiple register memory access operation is to amount to at least half of the M×N-bits of the line of memory.

20 Claims, 17 Drawing Sheets

Related U.S. Application Data

No. 15/238,186, filed on Aug. 16, 2016, now Pat. No. 9,786,338, which is a continuation of application No. 13/931,008, filed on Jun. 28, 2013, now Pat. No. 9,424,034.

(56) References Cited

U.S. PATENT DOCUMENTS

| | | | |
|---|---|---|---|
| 6,014,684 | A | 1/2000 | Hoffman |
| 6,055,652 | A | 4/2000 | Zaidi et al. |
| 6,173,393 | B1 | 1/2001 | Palanca et al. |
| 6,662,292 | B1 | 12/2003 | Wilson |
| 6,674,536 | B2 | 1/2004 | Long et al. |
| 6,807,622 | B1 | 10/2004 | McGrath |
| 7,389,317 | B2 | 6/2008 | Guttag et al. |
| 9,348,592 | B2 * | 5/2016 | Jha ............ G06F 9/30014 |
| 9,389,861 | B2 * | 7/2016 | Ould-Ahmed-Vall ......... G06F 9/30145 |
| 9,424,034 | B2 | 8/2016 | Hinton et al. |
| 9,619,226 | B2 * | 4/2017 | Hagog ............ G06F 9/30036 |
| 9,786,338 | B2 | 10/2017 | Hinton et al. |
| 2002/0010847 | A1 | 1/2002 | Abdallah et al. |
| 2004/0078608 | A1 | 4/2004 | Kanapathippillai et al. |
| 2005/0125640 | A1 | 6/2005 | Ford et al. |
| 2005/0125641 | A1 | 6/2005 | Ford et al. |
| 2006/0095717 | A1 | 5/2006 | Glossner et al. |
| 2008/0016319 | A1 | 1/2008 | Pappalardo et al. |
| 2008/0235496 | A1 | 9/2008 | Pechanek et al. |
| 2010/0106944 | A1 | 4/2010 | Symes et al. |
| 2011/0040939 | A1 | 2/2011 | Wilson et al. |
| 2012/0060015 | A1 | 3/2012 | Eichenberger et al. |
| 2014/0149718 | A1 | 5/2014 | Hughes et al. |
| 2014/0189296 | A1 | 7/2014 | Ould-Ahmed-Vall et al. |
| 2014/0372727 | A1 | 12/2014 | Valentine et al. |
| 2015/0006848 | A1 | 1/2015 | Hinton et al. |
| 2016/0358636 | A1 | 12/2016 | Hinton et al. |

FOREIGN PATENT DOCUMENTS

| | | |
|---|---|---|
| RU | 2006120158 A | 12/2007 |
| WO | 2014/210363 A1 | 12/2014 |

OTHER PUBLICATIONS

Office Action received for Korean Patent Application No. 10-2015-7031473, dated Oct. 20, 2016, 15 pages of Korean Office Action including 7 pages of English Translation.

Response for Korean Patent Application No. 10-2015-7031473 filed Nov. 30, 2017 to Office Action dated Aug. 31, 2017, 15 pages.

Notice of Allowance received for Taiwan Patent Application No. 103122085, dated Oct. 20, 2016, 3 pages of Taiwan Notice of Allowance including 1 page of English Translation.

Office Action and search report received for Taiwan Patent Application No. 103122085, dated Mar. 14, 2016, 5 pages of Taiwan Office Action Only.

Response for Taiwan Patent Application No. 103122085 filed Sep. 14, 2016 to Office Action dated Mar. 14, 2016, 11 pages.

Non-Final Office Action received for U.S. Appl. No. 13/931,008, dated Nov. 4, 2015, 26 pages.

Notice of Allowance received for U.S Appl. No. 13/931,008, dated Apr. 20, 2016, 5 pages.

Response for U.S. Appl. No. 13/931,008, filed Apr. 4, 2016 to Non-Final Office Action dated Nov. 4, 2015, 11 pages.

Supplemental Notice of Allowance received for U.S Appl. No. 13/931,008, dated Jun. 22, 2016, 2 pages.

Extended European Search Report received for European Patent Application No. 14817022.8, dated Jan. 23, 2017, 9 pages.

Response for European Patent Application No. 14817022.8 filed Aug. 9, 2017 to EESR dated Jan. 23, 2017, 17 pages.

Non-Final Office Action received for U.S. Appl. No. 15/238,186, dated Nov. 4, 2016, 4 pages.

Notice of Allowance received for U.S. Appl. No. 15/238,186, dated Jun. 8, 2017, 5 pages.

Response for U.S. Appl. No. 115/238,186, filed May 4, 2017 to Non-Final Office Action dated Nov. 4, 2016, 7 pages.

Supplemental Notice of Allowance received for U.S. Appl. No. 15/238,186, dated Jun. 20, 2017, 2 pages.

Office Action received for Chinese Patent Application No. 201480030741.2, dated Apr. 25, 2017, 44 pages of Chinese Office Action including 25 pages of English Translation.

Notice of Allowance received for Russian Patent Application No. 2015151132, dated Jul. 10, 2017, 11 pages of Russian Notice of Allowance Only.

Office Action and Search Report received for Russian Patent Application No. 2015151132 , dated Nov. 21, 2016, 13 pages of Russian Office Action including 5 pages of English Translation.

International Preliminary Report on Patentability and Written Opinion received for PCT Patent Application No. PCT/US2014/044416, dated Jan. 7, 2016, 6 pages.

International Search Report and Written Opinion received for PCT Patent Application No. PCT/US2014/044416 dated Sep. 30, 2014, 9 pages.

Response for Chinese Patent Application No. 201480030741.2 filed Nov. 10, 2017 to Office Action dated Apr. 25, 2017, 11 pages.

Notice of Allowance received for Korean Patent Application No. 10-2015-7031473, dated Dec. 20, 2017, 3 pages of Korean Notice of Allowance including 1 page of English Translation.

Non-Final Office Action received for U.S. Appl. No. 15/728,293, dated Nov. 13, 2017, 5 pages.

Non-Final Office Action received for U.S. Appl. No. 15/855,585, dated Mar. 8, 2018, 7 pages.

Non-Final Office Action received for U.S. Appl. No. 15/855,600, dated Mar. 8, 2018, 7 pages.

Non-Final Office Action received for U.S. Appl. No. 15/855,609, dated Mar. 8, 2018, 6 pages.

Non-Final Office Action received for U.S. Appl. No. 15/855,626, dated Mar. 8, 2018, 7 pages.

Notice of Allowance received for Chinese Patent Application No. 201480030741.2, dated Mar. 8, 4 pages of Chinese Notice of Allowance including 2 pages of English Translation.

ARM, "ARM Architecture Reference Manual," ARMv7-A and ARMv7-R edition, Copyright © 1996-1998, 2000, 2004-2012, pp. i, ii, v-xii, A4-177, A7-274, A8-396, A8-397, A8-666, A8-667, A8-992, A8-923, A8-1020, A8-1081.

Notice of Allowance from U.S. Appl. No. 15/728,293, dated Jun. 6, 2018, 20 pages.

* cited by examiner

*FIG. 2*

METHOD OF PROCESSING
MULTIPLE REGISTER MEMORY
ACCESS INSTRUCTION
230

RECEIVE MULTIPLE REGISTER MEMORY ACCESS
INSTRUCTION INDICATING MEMORY LOCATION
AND INDICATING REGISTER — 231

PERFORM MULTIPLE REGISTER MEMORY ACCESS
OPERATION IN RESPONSE TO MULTIPLE
REGISTER MEMORY ACCESS INSTRUCTION,
OPERATION INVOLVING N-BIT DATA, IN EACH OF
N-BIT REGISTERS THAT COMPRISE INDICATED
REGISTER, AND DIFFERENT CORRESPONDING
N-BIT PORTIONS OF MxN-BIT LINE OF MEMORY, — 232
CORRESPONDING TO INDICATED MEMORY
LOCATION, IN WHICH TOTAL NUMBER OF BITS OF
N-BIT DATA IN N-BIT REGISTERS INVOLVED IN
MULTIPLE REGISTER MEMORY ACCESS
OPERATION AMOUNTS TO AT LEAST HALF OF
MxN-BITS OF LINE OF MEMORY

*FIG. 3*

METHOD OF PROCESSING
MULTIPLE REGISTER LOAD
FROM MEMORY INSTRUCTION
330

RECEIVE MULTIPLE REGISTER LOAD FROM MEMORY INSTRUCTION INDICATING MEMORY LOCATION AND INDICATING REGISTER — 331

PERFORM MULTIPLE REGISTER LOAD FROM MEMORY OPEATION IN RESPONSE TO MULTIPLE REGISTER LOAD FROM MEMORY INSTRUCTION, INCLUDING LOADING DIFFERENT N-BIT PORTIONS, OF MxN-BIT LINE OF MEMORY CORRESPONDING TO INDICATED MEMORY LOCATION, IN EACH OF N-BIT REGISTERS THAT COMPRISE INDICATED REGISTER, IN WHICH TOTAL NUMBER OF BITS OF DIFFERENT N-BIT PORTIONS LOADED IN N-BIT REGISTERS FROM MxN-BIT LINE OF MEMORY AMOUNTS TO AT LEAST HALF OF MxN-BITS OF LINE OF MEMORY — 332

*FIG. 4*

METHOD OF PROCESSING
MULTIPLE REGISTER WRITE
TO MEMORY INSTRUCTION
430

RECEIVE MULTIPLE REGISTER WRITE TO
MEMORY INSTRUCTION INDICATING MEMORY — 431
LOCATION AND INDICATING REGISTER

PERFORM MULTIPLE REGISTER WRITE TO
MEMORY OPERATION IN RESPONSE TO MULTIPLE
REGISTER WRITE TO MEMORY INSTRUCTION,
INCLUDING WRITING N-BIT DATA, FROM EACH OF
N-BIT REGISTERS THAT COMPRISE INDICATED
REGISTER, TO DIFFERENT CORRESPONDING — 432
N-BIT PORTIONS OF MxN-BIT LINE OF MEMORY
CORRESPONDING TO INDICATED MEMORY
LOCATION, IN WHICH TOTAL NUMBER OF BITS OF
N-BIT DATA WRITTEN FROM N-BIT REGISTERS TO
MxN-BIT LINE OF MEMORY AMOUNTS TO AT
LEAST HALF OF MxN-BITS OF LINE OF MEMORY

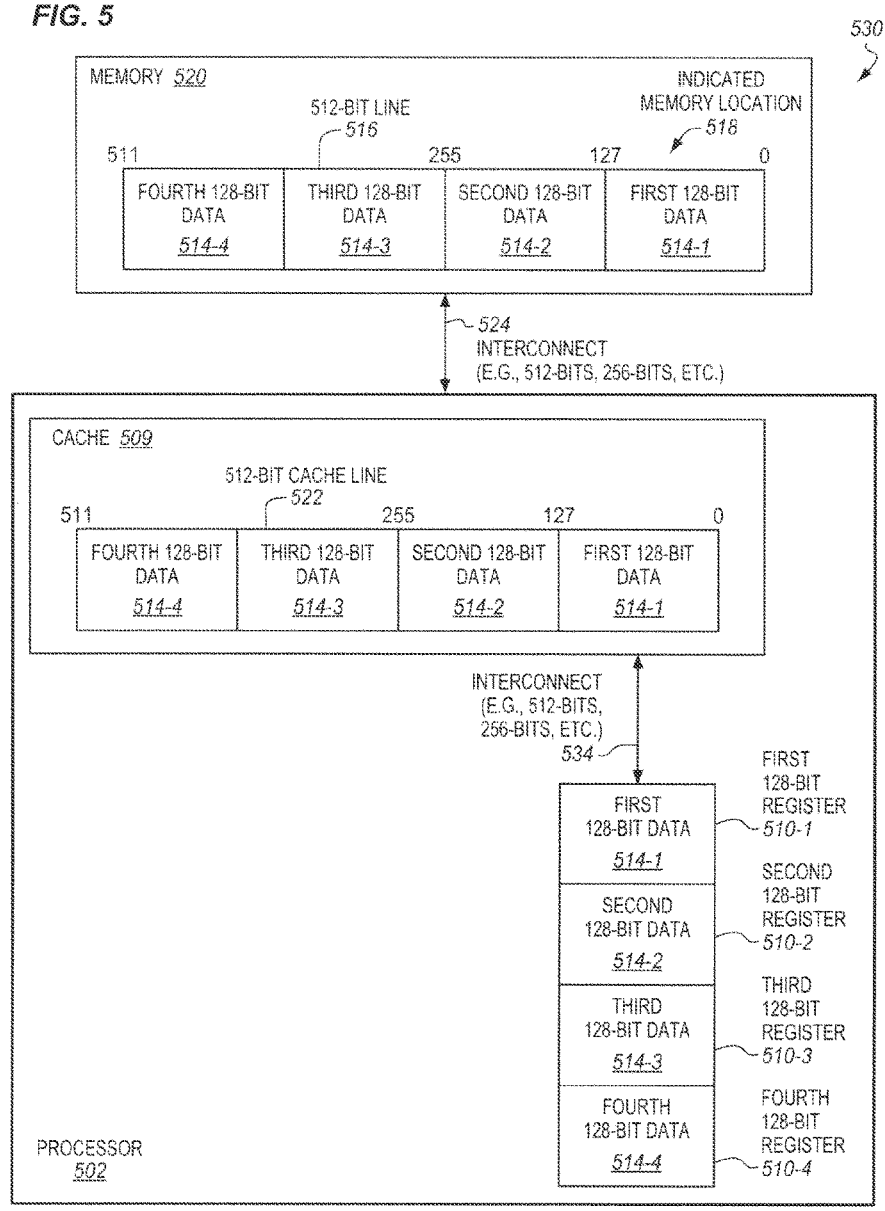

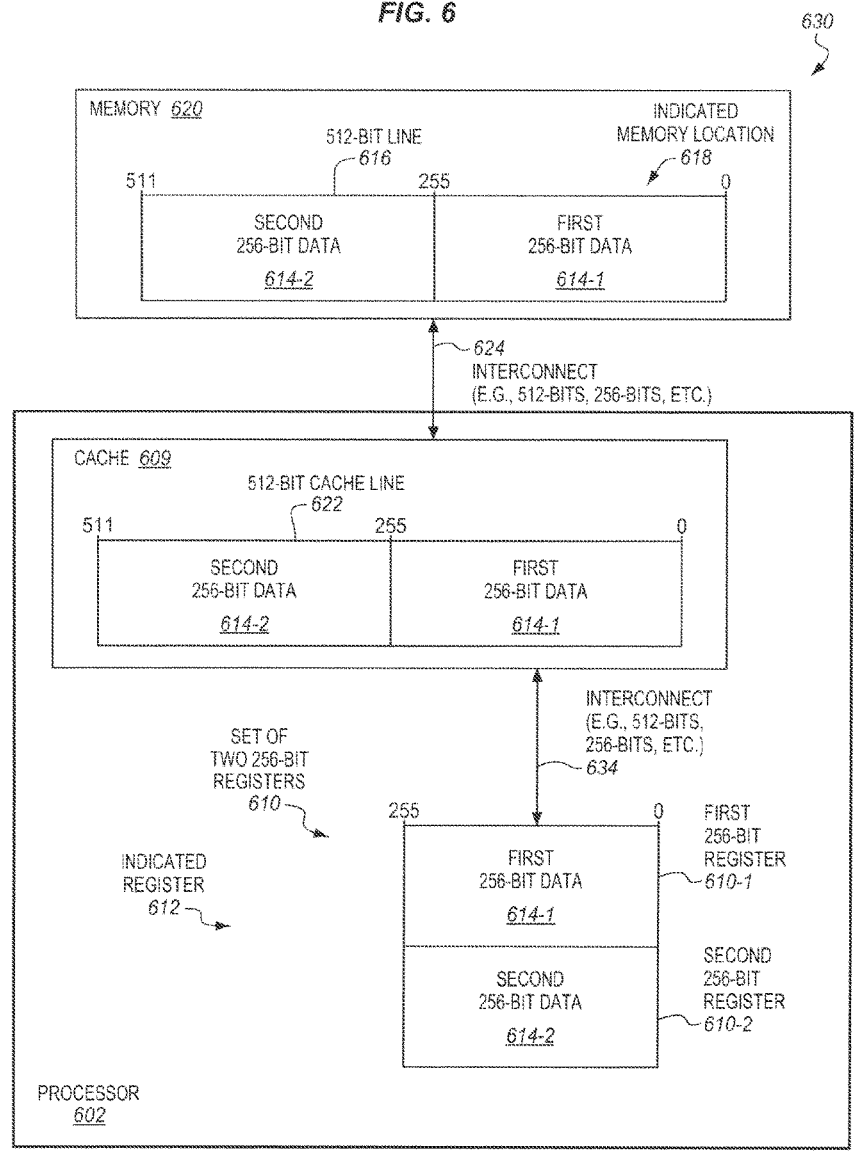

MULTIPLE REGISTER
MEMORY ACCESS
INSTRUCTION
904A

| OPCODE | MEMORY LOCATION SPECIFIER | REGISTER SPECIFIER |
|---|---|---|
| 950A | 952A | 954A |

FIG. 9A

MULTIPLE REGISTER
MEMORY ACCESS
INSTRUCTION
904B

| OPCODE | MEMORY LOCATION SPECIFIER | REGISTER SPECIFIER | NUMBER OF REGISTERS SPECIFIER |
|---|---|---|---|
| 950B | 952B | 954B | 956 |

FIG. 9B

MULTIPLE REGISTER
MEMORY ACCESS
INSTRUCTION
904C

| OPCODE | MEMORY LOCATION SPECIFIER | FIRST REGISTER SPECIFIER | SECOND REGISTER SPECIFIER | THIRD REGISTER SPECIFIER | FOURTH REGISTER SPECIFIER |
|---|---|---|---|---|---|
| 950C | 952C | 958-1 | 958-2 | 958-3 | 958-4 |

FIG. 9C

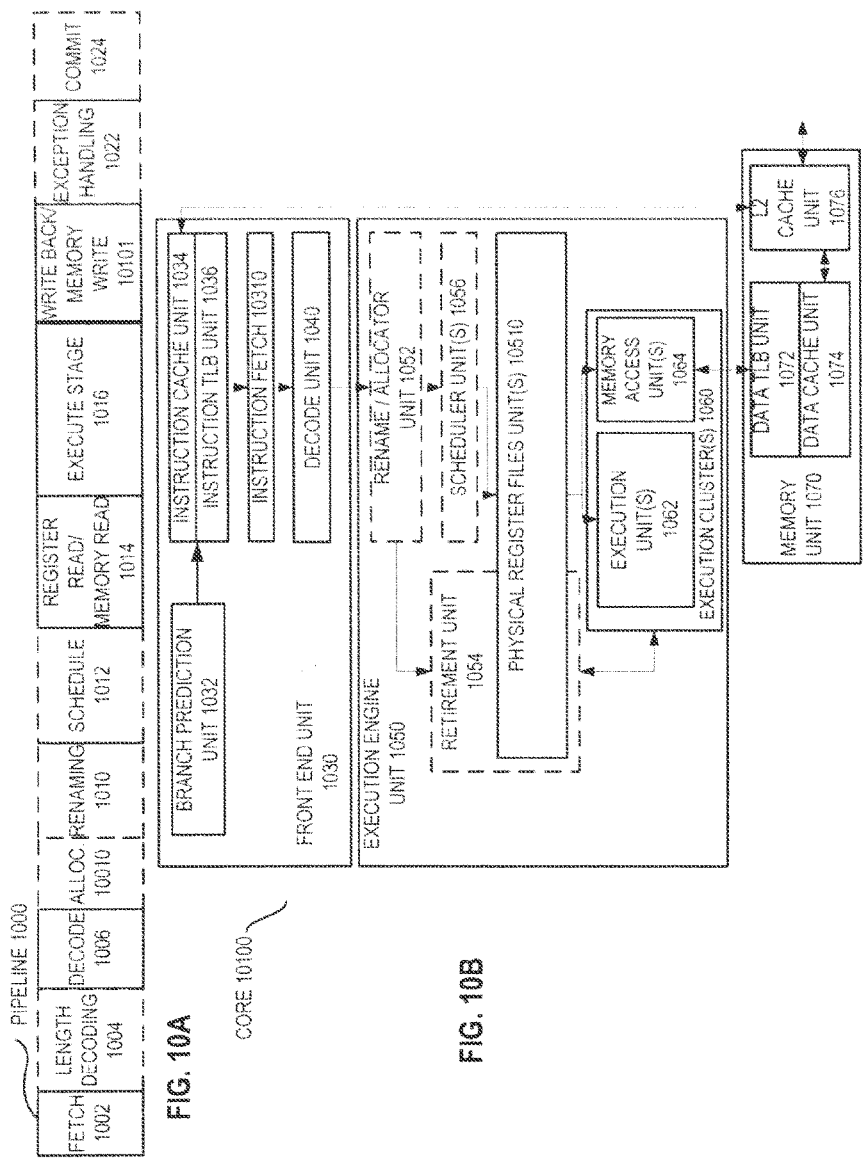

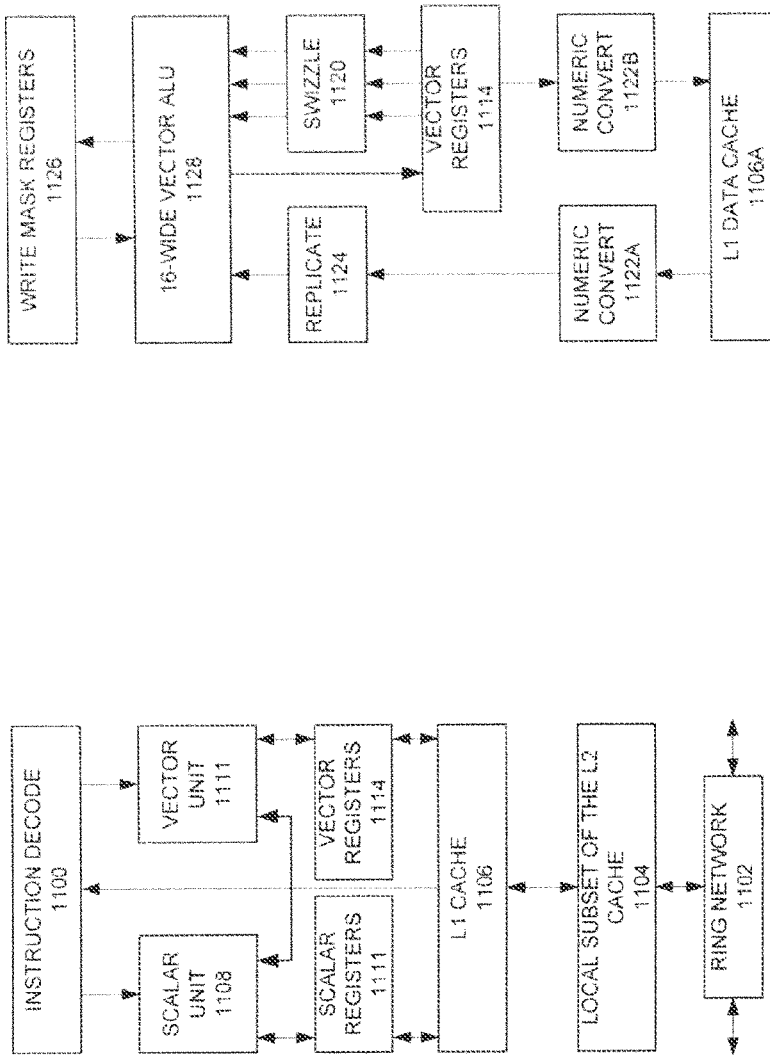

FIG. 12

MULTIPLE REGISTER MEMORY ACCESS INSTRUCTIONS, PROCESSORS, METHODS, AND SYSTEMS

RELATED APPLICATIONS

The present application is a continuation of U.S. patent application Ser. No. 15/728,293, filed on Oct. 9, 2017, entitled "MULTIPLE REGISTER MEMORY ACCESS INSTRUCTIONS, PROCESSORS, METHODS, AND SYSTEMS", which is a continuation of U.S. patent application Ser. No. 15/238,186, filed on Aug. 16, 2016, now U.S. Pat. No. 9,786,338, issued on Oct. 10, 2017, which is a Continuation of U.S. patent application Ser. No. 13/931,008, filed on Jun. 28, 2013, now U.S. Pat. No. 9,424,034, issued on Aug. 23, 2016, which is hereby incorporated herein by this reference in its entirety and for all purposes.

BACKGROUND

Technical Field

Embodiments described herein generally relate to processors. In particular, embodiments described herein generally relate to accessing data in memory with processors.

Background Information

Many processors have Single Instruction, Multiple Data (SIMD) architectures. In SIMD architectures, a packed data instruction, vector instruction, or SIMD instruction may operate on multiple data elements (e.g., multiple pairs of data elements) concurrently or in parallel. Multiple data elements may be packed within a register or memory location as packed data. In packed data, the bits of the register or other storage location may be logically divided into a sequence of data elements. For example, a 64-bit wide packed data register may have two packed 32-bit data elements, four packed 16-bit data elements, or eight packed 8-bit data elements. The processor may have parallel execution hardware responsive to the packed data instruction to perform the multiple operations concurrently (e.g., in parallel).

In some processors, there has been a progressive increase over the years in the width of the packed data operands. This increase in width of the packed data operands generally allows more data elements to be processed concurrently (e.g., in parallel), which generally helps to improve performance. For example, a 128-bit wide packed data operand may have four 32-bit data elements (instead of just two in the case of a 64-bit wide packed data operand), eight packed 16-bit data elements (instead of just four in the case of a 64-bit wide packed data operand), and so on.

In certain processors, the increase in the width of the packed data operands is accompanied by a corresponding increase in the width of the registers. However, one possible drawback to increasing the width of the registers is an increase in the area or footprint occupied by the registers on die. For example, expanding each register of a set of 64-bit registers so that they are each 128-bit registers will likely approximately double the area or footprint occupied by the registers on die. The impact will likely even be larger in implementations where there are more physical registers implemented than architectural registers since the size of a greater number of registers may be approximately doubled. Another possible drawback to such an increase in the width of the registers is a corresponding increase in the amount of state, context, or other data stored in the registers that needs to be moved to and from the registers (e.g., saved and restored) on context switches, power mode state saves, and like transitions. For example, for each register 128-bits instead of just 64-bits may need to be swapped in and out on context changes.

Processors typically execute instructions to load data (e.g., packed data operands) from memory and store data (e.g., packed data operands) to memory. For example, a processor may execute a load from memory instruction to load or read a packed data operand from the memory into a destination register. The processor may execute a write to memory instruction to write or store a packed data operand from a source register to the memory.

BRIEF DESCRIPTION OF THE DRAWINGS

The invention may best be understood by referring to the following description and accompanying drawings that are used to illustrate embodiments. In the drawings:

FIG. 2 is a block flow diagram of an embodiment of a method of processing an embodiment of a multiple register memory access instruction.

FIG. 3 is a block flow diagram of an embodiment of a method of processing an embodiment of a multiple register load from memory instruction.

FIG. 4 is a block flow diagram of an embodiment of a method of processing an embodiment of a multiple register write to memory instruction.

FIG. 5 is a block diagram of a first example embodiment of a suitable multiple register memory access operation.

FIG. 6 is a block diagram of a second example embodiment of a suitable multiple register memory access operation.

FIGS. 9A-9C are block diagrams of embodiments of suitable instruction formats for multiple register memory access instructions.

FIG. 10A is a block diagram illustrating both an exemplary in-order pipeline and an exemplary register renaming, out-of-order issue/execution pipeline according to embodiments of the invention.

FIG. 10B is a block diagram illustrating both an exemplary embodiment of an in-order architecture core and an exemplary register renaming, out-of-order issue/execution architecture core to be included in a processor according to embodiments of the invention.

FIG. 11A is a block diagram of a single processor core, along with its connection to the on-die interconnect network and with its local subset of the Level 2 (L2) cache, according to embodiments of the invention.

FIG. 11B is an expanded view of part of the processor core in FIG. 11A according to embodiments of the invention.

FIG. 12 is a block diagram of a processor that may have more than one core, may have an integrated memory controller, and may have integrated graphics according to embodiments of the invention.

DETAILED DESCRIPTION OF EMBODIMENTS

Figure 1:
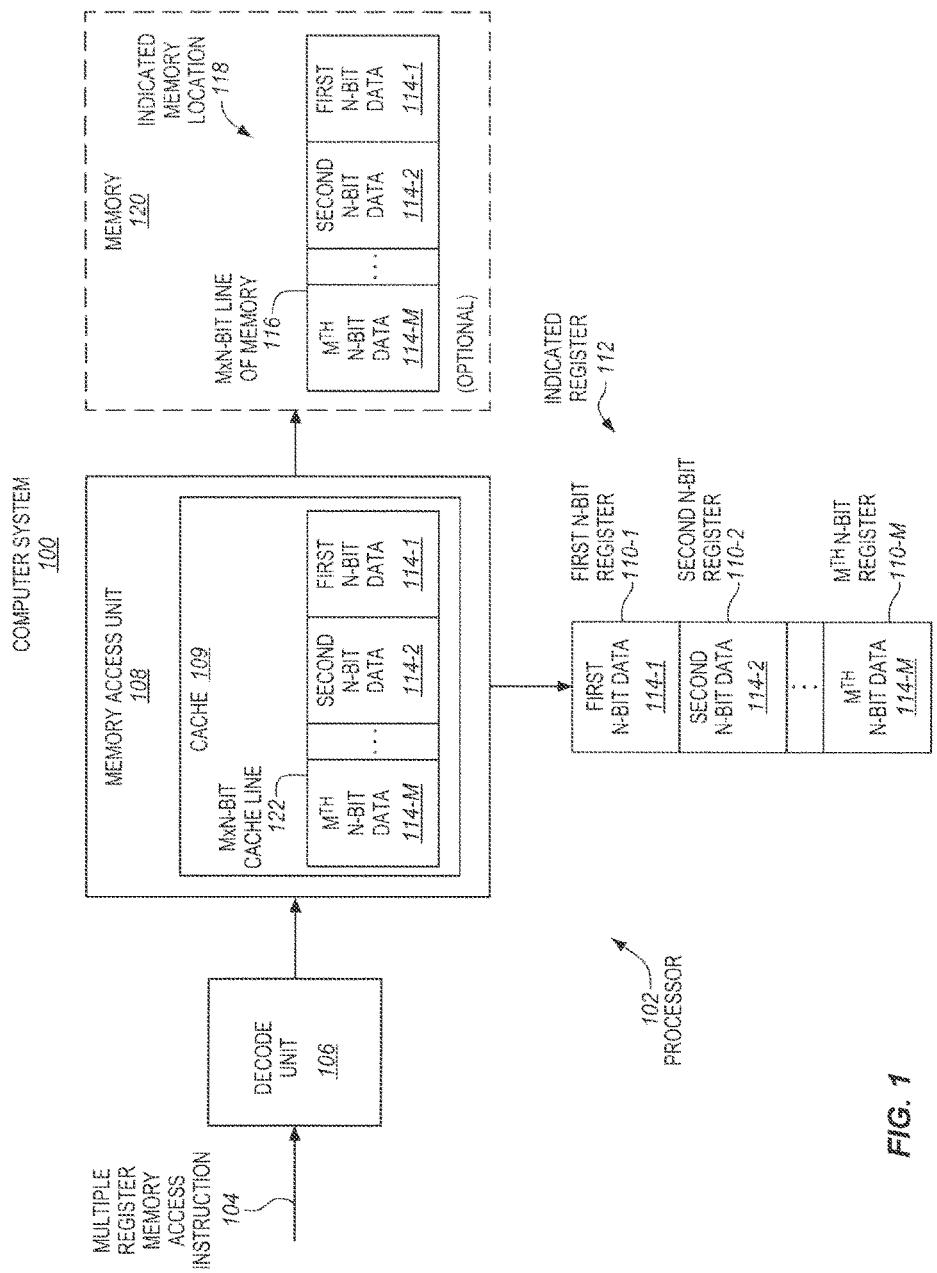
FIG. 1 is a block diagram of an embodiment of a computer system.

In the following description, numerous specific details are set forth (e.g., specific operations performed in response to instructions, specific numbers of registers, specific sizes of registers, specific sizes of cache lines, specific processor configurations, specific micro-architectural details, specific sequences of operations, etc.). However, embodiments may be practiced without these specific details. In other instances, well-known circuits, structures and techniques have not been shown in detail to avoid obscuring the understanding of the description.

Conventional memory access instructions often involve only a single register in the memory access. The amount of data exchanged between the memory and the single register is only the width of the single register (e.g., 64-bits in the case of 64-bit registers). However, commonly data in memory is organized as wider "lines." These lines of memory represent the amount of data transmitted or exchanged between the memory and the processor, for example one or more caches of the processor. For example, even though only 64-bits of data may actually be transmitted to or from the register file, commonly a wider whole line of memory having that 64-bits of data may be transmitted between the memory and a cache of the processor. The line of memory may be stored in a cache line within the cache. Many processors commonly use 512-bit wide lines of memory and corresponding 512-bit wide cache lines. A load of 64-bit data into a single destination register may load or retrieve an entire 512-bit line of memory having the 64-bit data into a 512-bit cache line of a cache of the processor and load only the 64-bit data into the single destination register. Only the 64-bits of data will actually be transmitted from the cache to the register file.

One potential drawback of such conventional "single register" memory access instructions is that the utilized bandwidth between the cache and the registers may tend to be relatively low, especially in processors that utilize relatively narrow registers to store packed data. In some cases, other data within the same line of memory and/or cache line may also be needed for processing, but conventionally is not brought into the registers by the instruction. For example, this may be the case for wide packed data operands in memory that are wider than the registers of the processor. In some cases, it may be desirable to load at least half a line of memory, or other cases an entire line of memory, into the registers of the processor. One possible way to load the entire 512-bit line of memory into eight 64-bit registers would be to use eight separate single 64-bit register load from memory instructions. For example, a first single 64-bit register load from memory instruction indicating a first 64-bit data of a 512-bit line in memory may load and store the indicated first 64-bit portion into a first indicated register. The entire 512-bit line of memory may be retrieved into the processor from the memory and stored in a 512-bit cache line. A second single 64-bit register load from memory instruction indicating a second 64-bit data of the 512-bit line in the memory may load the indicated second 64-bit portion from the already loaded 512-bit cache line and store the second 64-bit data in a second indicated register. Similarly, the third through eight single 64-bit register load from memory instructions may also use the data from the cache line already loaded in the cache. However, a possible drawback to such an approach is the need to execute multiple instructions, which tends to increase code size and processing time, and may involve multiple cache accesses.

Disclosed herein are multiple register memory access instructions, processors to execute the instructions, methods performed by the processors when processing or executing the instructions, and systems incorporating one or more processors to process or execute the instructions.

FIG. 1 is a block diagram of an embodiment of a computer system 100. In various embodiments, the computer system may represent a desktop computer, laptop computer, notebook computer, tablet computer, netbook, smartphone, personal digital assistant, cellular phone, server, network device (e.g., router or switch), Mobile Internet device (MID), media player, smart television, set-top box, video game controller, or other type of electronic device having at least one processor.

The computer system includes a processor 102 and a memory 120. The memory may include one or more memory devices of either the same or different types. One common type of memory that is suitable for embodiments is dynamic random access memory (DRAM), although other types of memory (e.g., flash memory) may also be used. The processor and the memory are coupled with one another by an interconnection mechanism 124. Any conventional interconnection mechanism known in the arts for coupling a processor with a memory is suitable. Examples of such mechanisms include, but are not limited to, interconnects, busses, hubs, memory controllers, chipsets, chipset components, and the like, and combinations thereof.

The processor 102 represents an instruction processing apparatus that is operable to process instructions. In some embodiments, the processor may be a general-purpose processor (e.g., a general-purpose microprocessor of the type used in desktop, laptop, and like computers). Alternatively, the processor may be a special-purpose processor. Examples of suitable special-purpose processors include, but are not limited to, network processors, communications processors, cryptographic processors, graphics processors, co-processors, embedded processors, digital signal processors (DSPs), and controllers (e.g., microcontrollers), to name just a few examples. The processor may be any of various complex instruction set computing (CISC) processors, various reduced instruction set computing (RISC) processors, various very long instruction word (VLIW) processors, various hybrids thereof, or other types of processors entirely.

The processor 102 may receive a multiple register memory access instruction 104. In some embodiments, the multiple register memory access instruction may represent a multiple register load from memory instruction. In other embodiments, the multiple register memory access instruction may represent a multiple register store to memory instruction. The multiple register memory access instruction may represent a machine code instruction, assembly language instruction, macroinstruction, or control signal of an instruction set of the processor. In some embodiments, the multiple register memory access instruction may explicitly specify (e.g., through a set of bits or one or more fields), or otherwise indicate (e.g., implicitly indicate), a memory location 118 in the memory 120, and may explicitly specify or otherwise indicate a register 112 (e.g., a register implemented by a set of N-bit registers 110).

The processor includes an instruction decode unit 106. The instruction decode unit may also be referred to as a decode unit, decoder, or decode logic. The decode unit may receive and decode relatively higher-level instructions (e.g., machine code instructions, assembly language instructions, macroinstructions), and output one or more relatively lower-level instructions or control signals (e.g., microinstructions, micro-operations, micro-code entry points) that reflect, represent, and/or are derived from the higher-level instructions. The one or more lower-level instructions or control signals may implement the higher-level instruction through one or more lower-level (e.g., circuit-level or hardware-level) operations. The decode unit may be implemented using various different mechanisms including, but not limited to, microcode read only memories (ROMs), look-up tables, hardware implementations, programmable logic arrays (PLAs), and other mechanisms used to implement decode units known in the art.

In other embodiments, an instruction emulator, translator, morpher, interpreter, or other instruction conversion logic may be used. Various different types of instruction conversion logic are known in the arts and may be implemented in software, hardware, firmware, or a combination thereof. The instruction conversion logic may emulate, translate, morph, interpret, or otherwise convert the instruction into one or more corresponding derived instructions or control signals. In some embodiments, both instruction conversion logic and a decode unit may be used. For example, the instruction conversion logic may convert an instruction into one or more intermediate instructions, and the decode unit may decode the one or more intermediate instructions into one or more lower-level instructions or control signals executable by integrated circuitry of the processor. The instruction conversion logic may be located outside the processor (e.g., on a separate die or in memory), on the processor, or a combination.

Referring again to FIG. 1, a memory access unit 108 is coupled with the decode unit 106. The memory access unit may receive one or more decoded or otherwise converted instructions or control signals that represent and/or are derived from the multiple register memory access instruction 104. The memory access unit is also coupled with the memory 120 through the interconnection mechanism 124. The memory access unit may implement one or more components often found in the memory subsystem of processors to access or interact with the memory. Examples of such components include, but are not limited to, memory access logic, a bus interface unit, one or more levels of cache, one or more translation lookaside buffers (TLSs), virtual address translation logic, etc. As shown, the memory access unit may have at least one cache 109.

The processor 102 also includes a set of N-bit registers 110. Each of the registers may represent an on-die storage location that is operable to store data, for example N-bit data. In some embodiments, the N-bit registers may represent packed data registers that are operable to store N-bit packed data, vector data, or single instruction multiple data (SIMD) data, although this is not required. In various embodiments, the N-bit registers may be 64-bit registers, 128-bit registers, or 256-bit registers. Alternatively, the N-bit registers may have other sizes (e.g., 32-bit registers, 80-bit registers, etc.). In some embodiments, the set of N-bit registers may include, implement, or otherwise comprise the register 112 that is indicated by the multiple register memory access instruction. The registers may be visible to software and/or a programmer and/or may be specified by instructions of the instruction set to identify operands. The registers may be implemented in different ways in different microarchitectures using well-known techniques and are not limited to any particular type of circuit. Examples of suitable types of registers include, but are not limited to, dedicated physical registers, dynamically allocated physical registers using register renaming, and combinations thereof.

As previously mentioned, in some embodiments, the multiple register memory access instruction 104 may explicitly specify (e.g., through a set of bits or one or more fields), or otherwise indicate (e.g., implicitly indicate) a register 112. In some embodiments, the set of N-bit registers may include, implement, or otherwise comprise the register 112 indicated by the multiple register memory access instruction. Moreover, in some embodiments, the multiple register memory access instruction may explicitly specify or otherwise indicate a memory location 118 in the memory. In some embodiments, data in the memory may be organized as lines of memory. The illustration shows an M×N-bit line of memory 116 that corresponds to the indicated memory location 118 (for example includes data at the indicated memory location). The M×N-bit line of memory has an integer M number of N-bit wide portions of data. As shown, the M×N-bit line of memory may have a first N-bit data 114-1 through an Mth N-bit data 114-M. In some embodiments, the M×N-bit line is at least 512-bits. In one embodiment, the integer N may be 128-bits and the integer M may be four. In another embodiment, the integer N may be 256-bits and the integer M may be two. In yet another embodiment, the integer N may be 64-bits and the integer M may be eight. In other embodiments, the M×N-bit line width may have other widths (e.g., 256-bits, at least 512-bits, 1024-bits, etc.). The number M of N-bit data elements is generally equal to the width of the line of memory divided by the width of the N-bit data elements. In some embodiments, the M×N-bit line may have a width equal to that of a cache line of the processor.

In some embodiments, the memory access unit 108 may be operable in response to and/or as a result of the multiple register memory access instruction 104 (e.g., in response to the one or more decoded or otherwise converted instructions or control signals that represent and/or are derived from the multiple register memory access instruction) to perform a multiple register memory access operation. In some embodiments, the multiple register memory access operation may involve N-bit data, in each of a plurality of N-bit registers 110 that are to include, implement, or otherwise comprise the register 112 indicated by the instruction 104. Moreover, in some embodiments, the multiple register memory access operation may also involve different corresponding N-bit portions 114 of the M×N-bit line of memory 116 that is to correspond to the indicated memory location 118. As shown, the M×N-bit line of memory may be stored in an M×N-bit cache line 122 of the cache 109, for example, in a generally conventional way. The memory access unit and/or the processor may include specific or particular logic (e.g., circuitry or other hardware potentially combined with firmware and/or software) operable to perform the operations responsive to the instruction.

In some embodiments, the multiple register memory access instruction may be a multiple register load from memory instruction. In response to the multiple register load from memory instruction, in some embodiments, the processor may load the different N-bit portions of the M×N-bit line of memory in each of the plurality of the N-bit registers. In other embodiments, the multiple register memory access instruction may be a multiple register write to memory instruction. In response to the multiple register write to memory instruction, in some embodiments, the processor may write the N-bit data, from each of the plurality of the N-bit registers, to the different corresponding N-bit portions of the M×N-bit line of memory.

In some embodiments, a total number of bits involved in the multiple register memory access operation (e.g., the sum of the N-bit data in each of the plurality of N-bit registers 110 involved in the operation) may amount to at least half, or in some cases up to all, of the M×N-bits of the line of memory 116. In some embodiments, at least half, or in some cases up to all, of the M×N-bits of the line of memory may be transmitted from the cache 109 to the set of registers 110. In various embodiments, at least two, three, four, or more registers may be involved. As one example, in an embodiment where the M×N-bits is equal to 512-bits and N is equal to 128-bits, then in various aspects at least two 128-bit registers 110, in some cases three 128-bit registers 110, or in some cases four 128-bit registers 110, may be involved in the multiple register memory access operation. As another example, in an embodiment where the M×N-bits is equal to 512-bits and N is equal to 64-bits, then in various aspects at least three 64-bit registers 110, at least four 64-bit registers 110, or in some cases anywhere up to eight 64-bit registers 110, may be involved in the multiple register memory access operation. As yet another example, in an embodiment where the M×N-bits is equal to 512-bits and N is equal to 256-bits, two 256-bit registers 110 may be involved in the multiple register memory access operation.

To avoid obscuring the description, a relatively simple processor 102 has been shown and described. In other embodiments, the processor may optionally include other well-known components found in processors. Examples of such components include, but are not limited to, a branch prediction unit, an instruction fetch unit, instruction and data translation lookaside buffers, prefetch buffers, microinstruction queues, microinstruction sequencers, a register renaming unit, an instruction scheduling unit, a retirement unit, other components included in processors, and various combinations thereof. There are literally numerous different combinations and configurations of components in processors, and embodiments are not limited to any particular combination or configuration. Embodiments may be included in processors have multiple cores, logical processors, or execution engines at least one of which is able to perform an embodiment of an multiple register memory access instruction.

FIG. 2 is a block flow diagram of an embodiment of a method 230 of processing an embodiment of a multiple register memory access instruction. The method may be performed by and/or within a processor, instruction processing apparatus, integrated circuit, or the like.

The method includes receiving the multiple register memory access instruction, at block 231. In some embodiments, the multiple register memory access instruction may specify or otherwise indicate a memory location, and may specify or otherwise indicate a register. In various aspects, the instruction may be received at a processor, an instruction processing apparatus, or a portion thereof (e.g., an instruction fetch unit, a decode unit, an instruction converter, etc.). In various aspects, the instruction may be received from an off-die source (e.g., from memory, a disc, an interconnect, etc.), or from an on-die source (e.g., from an instruction cache, an instruction fetch unit, etc.).

The method includes performing a multiple register memory access operation in response to the multiple register memory access instruction, at block 232. In some embodiments, a memory access unit or other portion of the processor may perform the memory access operation. In some embodiments, the multiple register memory access operation may involve N-bit data, in each of a plurality of N-bit registers that include, implement, or otherwise comprise the indicated register, and different corresponding N-bit portions of an M×N-bit line of memory, corresponding to the indicated memory location (e.g., the M×N-bit line of memory includes the data at the indicated memory location).

In some embodiments, a total number of bits of the N-bit data in the plurality of the N-bit registers involved in the multiple register memory access operation may amount to at least half, or in some cases up to all, of the M×N-bits of the line of memory. In some embodiments, the total number of bits of the N-bit data in the plurality of the N-bit registers involved in the multiple register memory access operation may amount to at least 256-bits, at least 512-bits, or in some cases more bits (e.g., 1024-bits). In various embodiments, at least two, three, four, or more registers may be involved in the multiple register memory access operation.

FIG. 3 is a block flow diagram of an embodiment of a method 330 of processing an embodiment of a multiple register load from memory instruction. The method may be performed by and/or within a processor, instruction processing apparatus, integrated circuit, or the like.

The method includes receiving the multiple register load from memory instruction, at block 331. In some embodiments, the multiple register load from memory instruction may specify or otherwise indicate a memory location, and may specify or otherwise indicate a register. The instruction may be received in the various ways described above in conjunction with FIG. 2.

The method also includes performing a multiple register load from memory operation in response to the multiple register load from memory instruction, at block 332. In some embodiments, a memory access unit or other portion of the processor may perform the operation. In some embodiments, performing the operation may include loading different N-bit portions, of an M×N-bit line of memory corresponding to the indicated memory location, in each of a plurality of N-bit registers that comprise the indicated register. In some embodiments, this may include transmitting the different N-bit portions from an M×N-bit cache line from the cache to each of the different N-bit registers.

In some embodiments, a total number of bits of the different N-bit portions loaded in the plurality of the N-bit registers from the M×N-bit line of memory amounts to at least half, or in some cases up to all, of the M×N-bits of the line of memory. In some embodiments, the total number of bits of the different N-bit portions loaded in the plurality of the N-bit registers from the M×N-bit line of memory may amount to at least 256-bits, at least 512-bits, or in some cases more bits (e.g., 1024-bits). In various embodiments, at least two, three, four, or more registers may be involved in the multiple register load from memory operation. In one specific example, the operation may load different 128-bit portions of the line of memory which is at least 512-bits in each of at least four 128-bit registers. In another specific example, the operation may load different 256-bit portions of the line of memory which is at least 512-bits in each of at least two 256-bit registers.

FIG. 4 is a block flow diagram of an embodiment of a method 430 of processing an embodiment of a multiple register store to memory instruction. The method may be performed by and/or within a processor, instruction processing apparatus, integrated circuit, or the like.

The method includes receiving the multiple register store to memory instruction, at block 431. In some embodiments, the multiple register store to memory instruction may specify or otherwise indicate a memory location, and may specify or otherwise indicate a register. The instruction may be received in the various ways described above in conjunction with FIG. 2.

The method also includes performing a multiple register store to memory operation in response to the multiple register store to memory instruction, at block 432. In some embodiments, a memory access unit or other portion of the processor may perform the operation. In some embodiments, performing the operation may include writing N-bit data, from each of a plurality of N-bit registers that comprise the indicated register, to different corresponding N-bit portions of an M×N-bit line of memory corresponding to the indicated memory location. In some embodiments, this may include transmitting the N-bit data from each of the plurality of the N-bit registers to a cache and storing each of the different N-bit data in a different N-bit portion of an M×N-bit cache line.

In some embodiments, a total number of bits of the N-bit data written from the plurality of the N-bit registers to the M×N-bit line of memory may amount to at least half, or in some cases up to all, of the M×N-bits of the line of memory. In some embodiments, the total number of bits of the N-bit data written from the plurality of the N-bit registers to the M×N-bit line of memory may amount to at least 256-bits, at least 512-bits, or in some cases more bits (e.g., 1024-bits). In various embodiments, at least two, three, four, or more registers may be involved in the multiple register store to memory operation.

The methods of FIGS. 2-4 have been described in relatively basic form. However, operations may optionally be added to and/or removed from the methods. For example, in some embodiments, an operation may optionally be added to any of these methods to store N-bit data associated with the plurality of N-bit registers (e.g., to be loaded into the N-bit registers or being written from the N-bit registers) in different corresponding N-bit portions of an M×N-bit cache line in a cache. As another example, in some embodiments, an operation may optionally be added to any of these methods to transmit the N-bit data associated with the plurality of N-bit registers (e.g., to be loaded into the N-bit registers or being written from the N-bit registers) between a cache and the N-bit registers. As further examples, one or more operations may optionally be added to fetch instructions, decode instructions, retire instructions, or the like, or various combinations thereof.

In some embodiments, the operations and/or methods of any of FIGS. 2-4 may be performed by and/or within the processor of FIG. 1. Optionally, the details and optional details described above for the processor of FIG. 1 also optionally apply to the operations and/or methods of FIGS. 2-4, which in embodiments may be performed by and/or within such a processor. Alternatively, the operations and/or method of any of FIGS. 2-4 may be performed by and/or within a similar or different processor. Moreover, the processor of FIG. 1 may perform operations and/or methods the same as, similar to, or different than those of any of FIGS. 2-4.

FIG. 5 is a block diagram of a first example embodiment of a suitable multiple register memory access operation 530 that may be performed in response to a first example embodiment of a multiple register memory access instruction. The multiple register memory access instruction may indicate a memory location 518 in a memory 520 and a register 512 of a processor 502. In this embodiment, the indicated memory location is to correspond to a 512-bit line of memory 516 having four 128-bit data portions 514-1 through 514-4. For example, the 512-bit line of memory may store data at the indicated memory location. In this embodiment, the indicated register is to include, be implemented by, or otherwise comprise a set of four 128-bit registers 510. In some embodiments, the four 128-bit registers may be adjacent or sequential registers.

In this embodiment, the multiple register memory access operation is to involve four different 128-bit data portions 514, in each of the four 128-bit registers 510, and different corresponding 128-bit portions 514 of the 512-bit line of memory 516. For example, the operation may transfer or exchange data between the 512-bit line of memory and the set of four 128-bit registers. In some embodiments, the operation may be an embodiment of a multiple register load from memory operation and the 128-bit data portions 514 may be loaded or read from the 512-bit line of memory 516 into the four 128-bit registers 510. In other embodiments, the operation may be an embodiment of a multiple register write to memory operation and the 128-bit data portions 514 may be written or stored from the four 128-bit registers 510 to the 512-bit line of memory 516.

The 512-bit line of memory may also be stored in a 512-bit cache line 522 of a cache 509. In some embodiments, data may be exchanged between the memory and the processor (e.g., the cache) over an interconnect 524. In some embodiments, the interconnect 524 may have a bit-width of 512-bits, 256-bits, or some other bit width depending on the clock rates, etc. In some embodiments, data may be exchanged between the cache and the set of four 128-bit registers over an interconnect 534. In some embodiments, the interconnect 534 may have a bandwidth or bit width of 512-bits, or at least 256-bits, depending on the clock rates, etc. The scope of the invention is not limited to the bit widths of the interconnect 524 or 534.

FIG. 6 is a block diagram of a second example embodiment of a suitable multiple register memory access operation 630 that may be performed in response to a second example embodiment of a multiple register memory access instruction. The multiple register memory access instruction may indicate a memory location 618 in a memory 620 and a register 612 of a processor 602. In this embodiment, the indicated memory location is to correspond to a 512-bit line of memory 616 having two 256-bit data portions 614-1 through 614-2. For example, the 512-bit line of memory may store data at the indicated memory location. In this embodiment, the indicated register is to include, be implemented by, or otherwise comprise a set of two 256-bit registers 610-1, 610-2. In some embodiments, the two 256-bit registers may be adjacent or sequential registers.

In this embodiment, the multiple register memory access operation is to involve two different 256-bit data portions 614, in each of the two 256-bit registers 610, and different corresponding 256-bit portions 614 of the 512-bit line of memory 616. For example, the operation may transfer or exchange data between the 512-bit line of memory and the two 256-bit registers. In some embodiments, the operation may be an embodiment of a multiple register load from memory operation and the 256-bit data portions 614 may be loaded or read from the 512-bit line of memory 616 into the two 256-bit registers 610. In other embodiments, the operation may be an embodiment of a multiple register write to memory operation and the 256-bit data portions 614 may be written or stored from the two 256-bit registers 610 to the 512-bit line of memory 616.

The 512-bit line of memory may also be stored in a 512-bit cache line 622 of a cache 609. In some embodiments, data may be exchanged between the memory and the processor (e.g., the cache) over an interconnect 624. In some embodiments, the interconnect 624 may have a bit-width of 512-bits, 256-bits, or some other bit width depending on the clock rates, etc. In some embodiments, data may be exchanged between the cache and the set of two 256-bit registers over an interconnect 634. In some embodiments, the interconnect 634 may have a bandwidth or bit width of 512-bits, or at least 256-bits, depending on the clock rates, etc. The scope of the invention is not limited to the bit widths of the interconnect 624 or 634.

Figure 7:
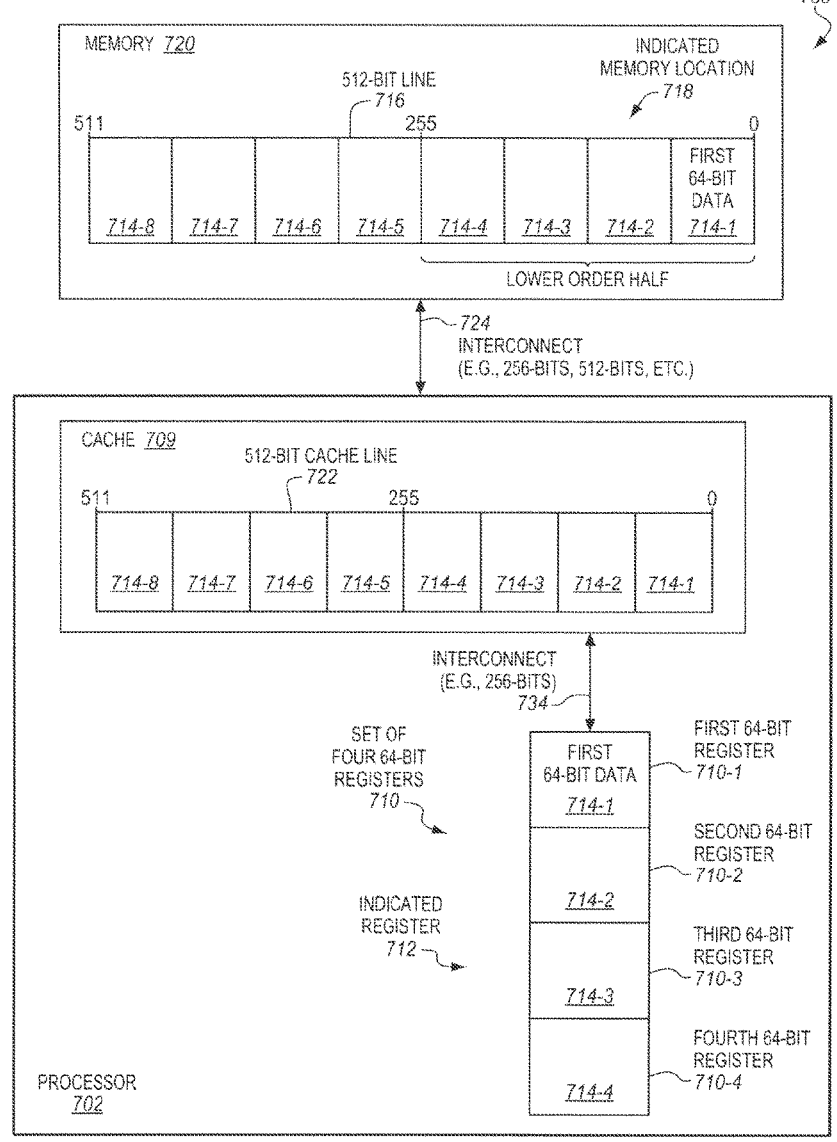
FIG. 7 is a block diagram of a third example embodiment of a suitable multiple register memory access operation.

FIG. 7 is a block diagram of a third example embodiment of a suitable multiple register memory access operation 730 that may be performed in response to a third example embodiment of a multiple register memory access instruction. The multiple register memory access instruction may indicate a memory location 718 in a memory 720 and a register 712 of a processor 702. In this embodiment, the indicated memory location is to correspond to a 512-bit line of memory 716 having eight 64-bit data portions 714-1 through 714-8. For example, the 512-bit line of memory may store data at the indicated memory location. In this embodiment, the indicated register is to include, be implemented by, or otherwise comprise a set of four 64-bit registers 710. In other embodiments, anywhere between four and eight 64-bit registers 710 may be used (e.g., six, eight, etc.). In some embodiments, the four or up to eight 64-bit registers may be adjacent or sequential registers.

In this embodiment, the multiple register memory access operation is to involve four (or up to eight) different 64-bit data portions 714, in each of the four (or up to eight) 64-bit registers 710, and different corresponding 64-bit portions 714 of the 512-bit line of memory 716. For example, the operation may transfer or exchange data between the four (or up to eight) data portions of the 512-bit line of memory and the four (or up to eight) 64-bit registers. In some embodiments, the operation may be an embodiment of a multiple register load from memory operation and the four (or up to eight) 64-bit data portions 714 may be loaded or read from the 512-bit line of memory 716 into the four (or up to eight) 64-bit registers 710. In other embodiments, the operation may be an embodiment of a multiple register write to memory operation and the four (or up to eight) 64-bit data portions 714 may be written or stored from the four (or up to eight) 64-bit registers 710 to the 512-bit line of memory 716. In the illustrated example embodiment, a lowest order half of the 512-bit line of memory (i.e., including lowest order four data portions 714-1 through 714-4) is used, although this is not required. In another embodiment, a highest order half, or some other portion, may be used instead.

The 512-bit line of memory may also be stored in a 512-bit cache line 722 of a cache 709. In some embodiments, data may be exchanged between the memory and the processor (e.g., the cache) over an interconnect 724. In some embodiments, the interconnect 724 may have a bit-width of 512-bits, 256-bits, or some other bit width depending on the clock rates, etc. In some embodiments, data may be exchanged between the cache and the set of four (or up to eight) 64-bit registers over an interconnect 734. In some embodiments, the interconnect 734 may have a bandwidth or bit width of 128-bits or 256-bits (e.g., in the case of only four registers being used), or 256-bits or 512-bits (e.g., in the case of up to eight registers being used), depending on the clock rates, etc. The scope of the invention is not limited to the bit widths of the interconnect 724 or 734.

It is to be appreciated that these are just a few illustrative examples of suitable operations. Other examples are contemplated in which either narrower (e.g., 256-bit) or wider (e.g., 1024-bit) lines of memory are used. Moreover, other examples are contemplated in which other sized data portions and/or registers (e.g., 32-bit registers) are used.

In some embodiments, a same set of registers may be viewed or accessed by a processor (e.g., a memory access unit, execution unit, etc.) as either a larger number of smaller registers or a fewer number of larger registers. The same two or more registers which may be viewed or accessed in one view as separate smaller registers may be viewed or accessed in the other view as a combined larger single register. For example, in some embodiments, an adjacent pair of registers may be viewed separately as two N/2-bit registers or may be logically combined or grouped together and viewed collectively as a single N-bit register. The same physical registers, and same total number of physical register bits, may be involved in both scenarios, but they may be viewed and accessed in different ways. One potential advantage of such an arrangement is the ability to store larger operands (e.g., packed data operands) without needing to increase the width of the underlying physical registers. This may have potential advantages such as avoiding an increase in the area or footprint the register file occupies on die, avoiding an increase in the amount of data that needs to be swapped in and out of the registers on context switches or power mode transitions, etc.

Figure 8:
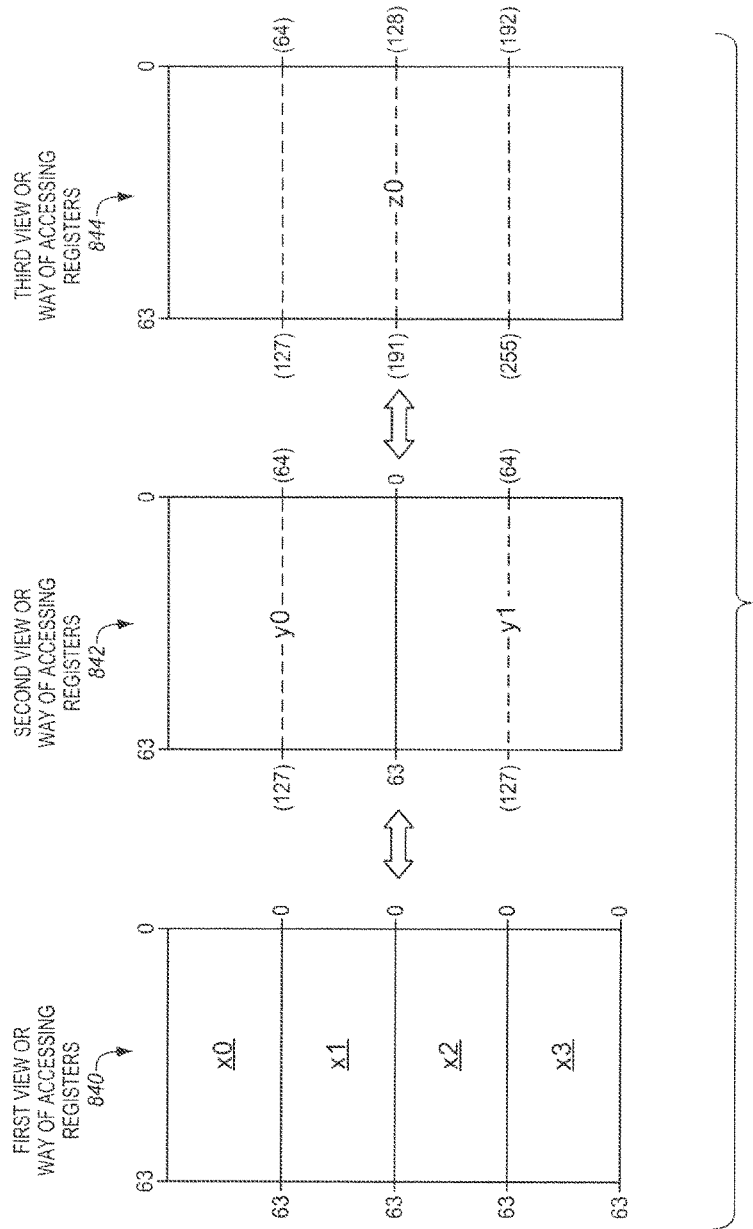
FIG. 8 is a block diagram illustrating an embodiment in which a set of registers may be viewed or accessed as 64-bit registers, 128-bit registers, and 256-bit registers in different views.

FIG. 8 is a block diagram illustrating an example embodiment in which a set of registers are viewed or accessed as 64-bit registers in a first view 840, 128-bit registers in a second view 842, and 256-bit registers in a third view 844. In the first view 840 the set of registers (e.g., physical registers) are logically viewed or accessed as four 64-bit packed data registers labeled X0-X3.

In the second view 842 the same set of registers (e.g., physical registers) are logically viewed or accessed as two (i.e., half as many) 128-bit registers labeled Y0-Y1. In the second view 842, the lowest order 64-bits (i.e., bits 63:0) of the 128-bit register Y0 maps or corresponds to the 64-bit register X0, whereas the highest order 64-bits (i.e., bits 127:64) of the 128-bit register Y0 maps or corresponds to the 64-bit register X1. Similarly, the lowest order 64-bits (i.e., bits 63:0) of the 128-bit register Y1 maps or corresponds to the 64-bit register X2, whereas the highest order 64-bits (i.e., bits 127:64) of the 128-bit register Y1 maps or corresponds to the 64-bit register X3. Multiple (in this case two) smaller (in this case 64-bit) registers are logically combined or grouped to form a single larger (in this case 128-bit) register.

In the third view 844 the same set of registers (e.g., physical registers) are logically viewed or accessed as a single 256-bit register labeled Z0. In the third view 844, the lowest order 64-bits (i.e., bits 63:0) of the 256-bit register Z0 maps or corresponds to the 64-bit register X0, the lowest intermediate order 64-bits (i.e., bits 127:64) of the 256-bit register Z0 maps or corresponds to the 64-bit register X1, the highest intermediate order 64-bits (i.e., bits 191:128) of the 256-bit register Z0 maps or corresponds to the 64-bit register X2, and the highest order 64-bits (i.e., bits 255:192) of the 256-bit register Z0 maps or corresponds to the 64-bit register X3. In the third view 844, the lowest order 128-bits (i.e., bits 127:0) of the 256-bit register Z0 maps or corresponds to the 128-bit register Y0, and the highest order 128-bits (i.e., bits 255:128) of the 256-bit register Z0 maps or corresponds to the 128-bit register Y1.

In various embodiments, the actual physical registers used to implement the views may be 64-bit registers, 32-bit registers, or 128-bit registers, although this is not required. In the illustrated embodiment adjacent or sequential registers are used, although this is not required. In other embodiments, non-adjacent registers may be combined (e.g., non-adjacent registers in different banks, alternating registers, etc.). In the illustrated embodiment, three different views are supported, although in other embodiments fewer (e.g. two) or more (e.g., four or more) different views may be supported.

Furthermore, in other embodiments, the views may use different numbers of bits. For example, in some embodiments, there may be a view where a set of registers may be logically viewed or accessed as a single 512-bit register in one view, and multiple smaller registers in another view (e.g., two 256-bit registers, four 128-bit registers, eight 64-bit registers, etc.). Moreover, in other embodiments, there may be a view where a set of registers may be logically viewed or accessed as a single 1024-bit register in one view, and multiple smaller registers in another view (e.g., two 512-bit registers and/or four 256-bit registers and/or eight 128-bit registers, and/or sixteen 64-bit registers, etc.).

FIG. 9A is a block diagram of a first embodiment of a suitable instruction format for a multiple register memory access instruction. The instruction format has an operation code or opcode 950A. The opcode may represent a plurality of bits or one or more fields that are operable to identify the instruction and/or the operation to be performed (e.g., a multiple register load from memory operation, a multiple register store to memory operation, or other multiple register memory access operation). The first instruction format also includes a memory location specifier 952A to specify a memory location. The memory location specifier may represent a plurality of bits or one or more fields. The specified memory location may represent a source in the case of a load from memory instruction, or a destination in the case of a write to memory instruction. By way of example, the specifier may be used to specify the starting location of the data to be loaded (e.g., the first byte of the data). The first instruction format also includes an optional register specifier 954A. The register specifier may specify a register. The register specifier may represent a plurality of bits or one or more fields. The specified register may represent a destination register in the case of a load from memory instruction, or a source register in the case of a write to memory instruction. Alternatively, the register specifier may optionally be omitted (e.g., the register may be implicitly indicated by the instruction instead of being explicitly specified). In some embodiments, one or more other registers may be indicated based on the explicitly specified or implicitly indicated register. For example, one or more predetermined registers may be implicitly indicated or implicitly associated with the explicitly specified or implicitly indicated register. For example, one or more adjacent, sequential, or consecutive registers may be associated with the register. As another example, every other register may be associated with the register. As yet another example, predetermined sequential registers in different register banks may be associated with the register. One specific example of such an embodiment where the instruction may implicitly indicate the registers is where the load or store operation involves all of the architecturally visible registers in the architecture. Alternatively, a given register may be dedicated to the multiple register load, store, or other operation and therefore may be implicit.

FIG. 9B is a block diagram of a second embodiments of a suitable instruction format for a multiple register memory access instruction. The second instruction format has an operation code or opcode 950B, a memory location specifier 952B, and a register specifier 954B. Each of these may be as previously described. The second instruction format also includes an optional number of registers specifier 956 to specify a number of registers involved in the memory access operation (e.g., to be used as a source in the case of a write to memory operation or a destination in the case of a load from memory operation). By way of example, the number of registers specifier may specify or indicate two registers, three registers, four registers, or some other number of registers. In other embodiments, rather than specifying the number of registers, it is also possible to specify the number of bits associated with the memory operation (e.g., as a multiple of a given register size or number of bits). This field is optional and not required. In another embodiment, the number of registers may be implicit (e.g., implicit to the register specifier 954B, implicit to the opcode 950B, etc.).

FIG. 9C is a block diagram of a third embodiments of a suitable instruction format for a multiple register memory access instruction. The third instruction format has an operation code or opcode 950C and a memory location specifier 952C. Each of these may be as previously described. The third instruction format also includes a plurality of optional register specifiers 958. In the illustrated embodiment, four register specifiers 958-1 through 958-4 are shown, although fewer (e.g., two, three), or more than four may alternatively be included. Each of these specifiers may represent a plurality of bits or one or more fields. These multiple register specifiers may allow explicit specification of the registers that are to be combined to be involved in the memory access operation. In some cases, this optional feature may be utilized to optimize or at least improve the performance of code, avoid or at least reduce the number of register-to-register operations to move data around, etc. These multiple register specifiers are optional and not required.

These are just a few examples of suitable instruction formats. It is to be appreciated that additional fields may optionally be added to any of these instruction formats. In other embodiments certain explicitly specified fields may instead optionally be implicit to the instruction. It is to be appreciated that the specifiers or fields need not include contiguous sequences of bits but may instead optionally be formed of non-contiguous bits. Specifiers or fields may optionally overlap. Additionally, the illustrated order/arrangement of the specifiers or fields is only illustrative. Other embodiments may move or rearrange the fields.

Exemplary Core Architectures, Processors, and Computer Architectures

Processor cores may be implemented in different ways, for different purposes, and in different processors. For instance, implementations of such cores may include: 1) a general purpose in-order core intended for general-purpose computing; 2) a high performance general purpose out-of-order core intended for general-purpose computing; 3) a special purpose core intended primarily for graphics and/or scientific (throughput) computing. Implementations of different processors may include: 1) a CPU including one or more general purpose in-order cores intended for general-purpose computing and/or one or more general purpose out-of-order cores intended for general-purpose computing; and 2) a coprocessor including one or more special purpose cores intended primarily for graphics and/or scientific (throughput). Such different processors lead to different computer system architectures, which may include: 1) the coprocessor on a separate chip from the CPU; 2) the coprocessor on a separate die in the same package as a CPU; 3) the coprocessor on the same die as a CPU (in which case, such a coprocessor is sometimes referred to as special purpose logic, such as integrated graphics and/or scientific (throughput) logic, or as special purpose cores); and 4) a system on a chip that may include on the same die the described CPU (sometimes referred to as the application core(s) or application processor(s)), the above described coprocessor, and additional functionality. Exemplary core architectures are described next, followed by descriptions of exemplary processors and computer architectures.

Exemplary Core Architectures

In-Order and Out-Of-Order Core Block Diagram

FIG. 10A is a block diagram illustrating both an exemplary in-order pipeline and an exemplary register renaming, out-of-order issue/execution pipeline according to embodiments of the invention. FIG. 10B is a block diagram illustrating both an exemplary embodiment of an in-order architecture core and an exemplary register renaming, out-of-order issue/execution architecture core to be included in a processor according to embodiments of the invention. The solid lined boxes in FIGS. 10A-B illustrate the in-order pipeline and in-order core, while the optional addition of the dashed lined boxes illustrates the register renaming, out-of-order issue/execution pipeline and core. Given that the in-order aspect is a subset of the out-of-order aspect, the out-of-order aspect will be described.

In FIG. 10A, a processor pipeline 1000 includes a fetch stage 1002, a length decode stage 1004, a decode stage 1006, an allocation stage 1008, a renaming stage 1010, a scheduling (also known as a dispatch or issue) stage 1012, a register read/memory read stage 1014, an execute stage 1016, a write back/memory write stage 1018, an exception handling stage 1022, and a commit stage 1024.

FIG. 10B shows processor core 1090 including a front end unit 1030 coupled to an execution engine unit 1050, and both are coupled to a memory unit 1070. The core 1090 may be a reduced instruction set computing (RISC) core, a complex instruction set computing (CISC) core, a very long instruction word (VLIW) core, or a hybrid or alternative core type. As yet another option, the core 1090 may be a special-purpose core, such as, for example, a network or communication core, compression engine, coprocessor core, general purpose computing graphics processing unit (GPGPU) core, graphics core, or the like.

The front end unit 1030 includes a branch prediction unit 1032 coupled to an instruction cache unit 1034, which is coupled to an instruction translation lookaside buffer (TLB) 1036, which is coupled to an instruction fetch unit 1038, which is coupled to a decode unit 1040. The decode unit 1040 (or decoder) may decode instructions, and generate as an output one or more micro-operations, micro-code entry points, microinstructions, other instructions, or other control signals, which are decoded from, or which otherwise reflect, or are derived from, the original instructions. The decode unit 1040 may be implemented using various different mechanisms. Examples of suitable mechanisms include, but are not limited to, look-up tables, hardware implementations, programmable logic arrays (PLAs), microcode read only memories (ROMs), etc. In one embodiment, the core 1090 includes a microcode ROM or other medium that stores microcode for certain macroinstructions (e.g., in decode unit 1040 or otherwise within the front end unit 1030). The decode unit 1040 is coupled to a rename/allocator unit 1052 in the execution engine unit 1050.

The execution engine unit 1050 includes the rename/allocator unit 1052 coupled to a retirement unit 1054 and a set of one or more scheduler unit(s) 1056. The scheduler unit(s) 1056 represents any number of different schedulers, including reservations stations, central instruction window, etc. The scheduler unit(s) 1056 is coupled to the physical register file(s) unit(s) 1058. Each of the physical register file(s) units 1058 represents one or more physical register files, different ones of which store one or more different data types, such as scalar integer, scalar floating point, packed integer, packed floating point, vector integer, vector floating point—status (e.g., an instruction pointer that is the address of the next instruction to be executed), etc. In one embodiment, the physical register file(s) unit 1058 comprises a vector registers unit, a write mask registers unit, and a scalar registers unit. These register units may provide architectural vector registers, vector mask registers, and general purpose registers. The physical register file(s) unit(s) 1058 is overlapped by the retirement unit 1054 to illustrate various ways in which register renaming and out-of-order execution may be implemented (e.g., using a reorder buffer(s) and a retirement register file(s); using a future file(s), a history buffer(s), and a retirement register file(s); using a register maps and a pool of registers; etc.). The retirement unit 1054 and the physical register file(s) unit(s) 1058 are coupled to the execution cluster(s) 1060. The execution cluster(s) 1060 includes a set of one or more execution units 1062 and a set of one or more memory access units 1064. The execution units 1062 may perform various operations (e.g., shifts, addition, subtraction, multiplication) and on various types of data (e.g., scalar floating point, packed integer, packed floating point, vector integer, vector floating point). While some embodiments may include a number of execution units dedicated to specific functions or sets of functions, other embodiments may include only one execution unit or multiple execution units that all perform all functions. The scheduler unit(s) 1056, physical register file(s) unit(s) 1058, and execution cluster(s) 1060 are shown as being possibly plural because certain embodiments create separate pipelines for certain types of data/operations (e.g., a scalar integer pipeline, a scalar floating point/packed integer/packed floating point/vector integer/vector floating point pipeline, and/or a memory access pipeline that each have their own scheduler unit, physical register file(s) unit, and/or execution cluster—and in the case of a separate memory access pipeline, certain embodiments are implemented in which only the execution cluster of this pipeline has the memory access unit(s) 1064). It should also be understood that where separate pipelines are used, one or more of these pipelines may be out-of-order issue/execution and the rest in-order.

The set of memory access units 1064 is coupled to the memory unit 1070, which includes a data TLB unit 1072 coupled to a data cache unit 1074 coupled to a level 2 (L2) cache unit 1076. In one exemplary embodiment, the memory access units 1064 may include a load unit, a store address unit, and a store data unit, each of which is coupled to the data TLB unit 1072 in the memory unit 1070. The instruction cache unit 1034 is further coupled to a level 2 (L2) cache unit 1076 in the memory unit 1070. The L2 cache unit 1076 is coupled to one or more other levels of cache and eventually to a main memory.

By way of example, the exemplary register renaming, out-of-order issue/execution core architecture may implement the pipeline 1000 as follows: 1) the instruction fetch 1038 performs the fetch and length decoding stages 1002 and 1004; 2) the decode unit 1040 performs the decode stage 1006; 3) the rename/allocator unit 1052 performs the allocation stage 1008 and renaming stage 1010; 4) the scheduler unit(s) 1056 performs the schedule stage 1012; 5) the physical register file(s) unit(s) 1058 and the memory unit 1070 perform the register read/memory read stage 1014; the execution cluster 1060 perform the execute stage 1016; 6) the memory unit 1070 and the physical register file(s) unit(s) 1058 perform the write back/memory write stage 1018; 7) various units may be involved in the exception handling stage 1022; and 8) the retirement unit 1054 and the physical register file(s) unit(s) 1058 perform the commit stage 1024.

The core 1090 may support one or more instructions sets (e.g., the x86 instruction set (with some extensions that have been added with newer versions); the MIPS instruction set of MIPS Technologies of Sunnyvale, Calif.; the ARM instruction set (with optional additional extensions such as NEON) of ARM Holdings of Sunnyvale, Calif.), including the instruction(s) described herein. In one embodiment, the core 1090 includes logic to support a packed data instruction set extension (e.g., AVX1, AVX2), thereby allowing the operations used by many multimedia applications to be performed using packed data.

It should be understood that the core may support multithreading (executing two or more parallel sets of operations or threads), and may do so in a variety of ways including time sliced multithreading, simultaneous multithreading (where a single physical core provides a logical core for each of the threads that physical core is simultaneously multithreading), or a combination thereof (e.g., time sliced fetching and decoding and simultaneous multithreading thereafter such as in the Intel® Hyperthreading technology).

While register renaming is described in the context of out-of-order execution, it should be understood that register renaming may be used in an in-order architecture. While the illustrated embodiment of the processor also includes separate instruction and data cache units 1034/1074 and a shared L2 cache unit 1076, alternative embodiments may have a single internal cache for both instructions and data, such as, for example, a Level 1 (L1) internal cache, or multiple levels of internal cache. In some embodiments, the system may include a combination of an internal cache and an external cache that is external to the core and/or the processor. Alternatively, all of the cache may be external to the core and/or the processor.

Specific Exemplary In-Order Core Architecture

FIGS. 11A-B illustrate a block diagram of a more specific exemplary in-order core architecture, which core would be one of several logic blocks (including other cores of the same type and/or different types) in a chip. The logic blocks communicate through a high-bandwidth interconnect network (e.g., a ring network) with some fixed function logic, memory I/O interfaces, and other necessary I/O logic, depending on the application.

FIG. 11A is a block diagram of a single processor core, along with its connection to the on-die interconnect network 1102 and with its local subset of the Level 2 (L2) cache 1104, according to embodiments of the invention. In one embodiment, an instruction decoder 1100 supports the x86 instruction set with a packed data instruction set extension. An L1 cache 1106 allows low-latency accesses to cache memory into the scalar and vector units. While in one embodiment (to simplify the design), a scalar unit 1108 and a vector unit 1110 use separate register sets (respectively, scalar registers 1112 and vector registers 1114) and data transferred between them is written to memory and then read back in from a level 1 (L1) cache 1106, alternative embodiments of the invention may use a different approach (e.g., use a single register set or include a communication path that allow data to be transferred between the two register files without being written and read back).

The local subset of the L2 cache 1104 is part of a global L2 cache that is divided into separate local subsets, one per processor core. Each processor core has a direct access path to its own local subset of the L2 cache 1104. Data read by a processor core is stored in its L2 cache subset 1104 and can be accessed quickly, in parallel with other processor cores accessing their own local L2 cache subsets. Data written by a processor core is stored in its own L2 cache subset 1104 and is flushed from other subsets, if necessary. The ring network ensures coherency for shared data. The ring network is bi-directional to allow agents such as processor cores, L2 caches and other logic blocks to communicate with each other within the chip. Each ring data-path is 1012-bits wide per direction.

FIG. 11B is an expanded view of part of the processor core in FIG. 11A according to embodiments of the invention. FIG. 11B includes an L1 data cache 1106A part of the L1 cache 1104, as well as more detail regarding the vector unit 1110 and the vector registers 1114. Specifically, the vector unit 1110 is a 16-wide vector processing unit (VPU) (see the 16-wide ALU 1128), which executes one or more of integer, single-precision float, and double-precision float instructions. The VPU supports swizzling the register inputs with swizzle unit 1120, numeric conversion with numeric convert units 1122A-B, and replication with replication unit 1124 on the memory input. Write mask registers 1126 allow predicating resulting vector writes.

Processor with Integrated Memory Controller and Graphics

Figure 12:
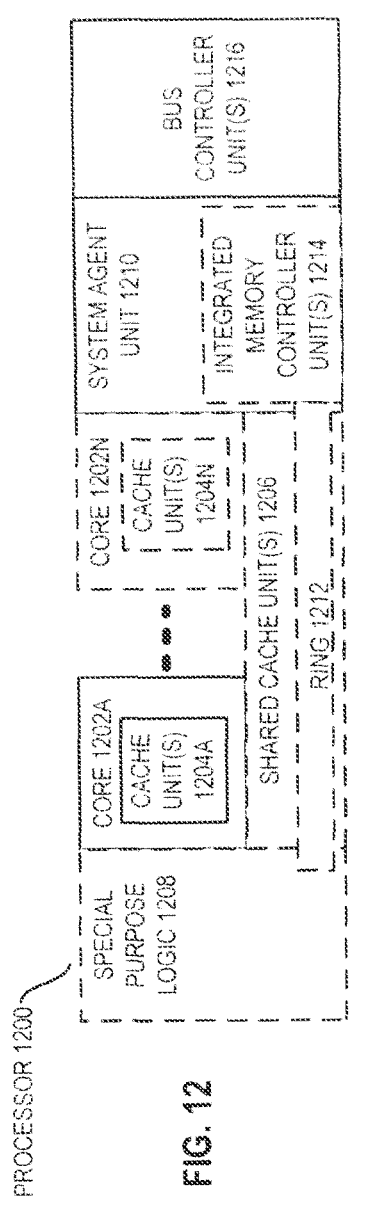

FIG. 12 is a block diagram of a processor 1200 that may have more than one core, may have an integrated memory controller, and may have integrated graphics according to embodiments of the invention. The solid lined boxes in FIG. 12 illustrate a processor 1200 with a single core 1202A, a system agent 1210, a set of one or more bus controller units 1216, while the optional addition of the dashed lined boxes illustrates an alternative processor 1200 with multiple cores 1202A-N, a set of one or more integrated memory controller unit(s) 1214 in the system agent unit 1210, and special purpose logic 1208.

Thus, different implementations of the processor 1200 may include: 1) a CPU with the special purpose logic 1208 being integrated graphics and/or scientific (throughput) logic (which may include one or more cores), and the cores 1202A-N being one or more general purpose cores (e.g., general purpose in-order cores, general purpose out-of-order cores, a combination of the two); 2) a coprocessor with the cores 1202A-N being a large number of special purpose cores intended primarily for graphics and/or scientific (throughput); and 3) a coprocessor with the cores 1202A-N being a large number of general purpose in-order cores. Thus, the processor 1200 may be a general-purpose processor, coprocessor or special-purpose processor, such as, for example, a network or communication processor, compression engine, graphics processor, GPGPU (general purpose graphics processing unit), a high-throughput many integrated core (MIC) coprocessor (including 30 or more cores), embedded processor, or the like. The processor may be implemented on one or more chips. The processor 1200 may be a part of and/or may be implemented on one or more substrates using any of a number of process technologies, such as, for example, BiCMOS, CMOS, or NMOS.

The memory hierarchy includes one or more levels of cache within the cores, a set or one or more shared cache units 1206, and external memory (not shown) coupled to the set of integrated memory controller units 1214. The set of shared cache units 1206 may include one or more mid-level caches, such as level 2 (L2), level 3 (L3), level 4 (L4), or other levels of cache, a last level cache (LLC), and/or combinations thereof. While in one embodiment a ring based interconnect unit 1212 interconnects the integrated graphics logic 1208, the set of shared cache units 1206, and the system agent unit 1210/integrated memory controller unit(s) 1214, alternative embodiments may use any number of well-known techniques for interconnecting such units. In one embodiment, coherency is maintained between one or more cache units 1206 and cores 1202-A-N.

In some embodiments, one or more of the cores 1202A-N are capable of multi-threading. The system agent 1210 includes those components coordinating and operating cores 1202A-N. The system agent unit 1210 may include for example a power control unit (PCU) and a display unit. The PCU may be or include logic and components needed for regulating the power state of the cores 1202A-N and the integrated graphics logic 1208. The display unit is for driving one or more externally connected displays.

The cores 1202A-N may be homogenous or heterogeneous in terms of architecture instruction set; that is, two or more of the cores 1202A-N may be capable of execution the same instruction set, while others may be capable of executing only a subset of that instruction set or a different instruction set.

Exemplary Computer Architectures

FIGS. 13-16 are block diagrams of exemplary computer architectures. Other system designs and configurations known in the arts for laptops, desktops, handheld PCs, personal digital assistants, engineering workstations, servers, network devices, network hubs, switches, embedded processors, digital signal processors (DSPs), graphics devices, video game devices, set-top boxes, micro controllers, cell phones, portable media players, hand held devices, and various other electronic devices, are also suitable. In general, a huge variety of systems or electronic devices capable of incorporating a processor and/or other execution logic as disclosed herein are generally suitable.

Figure 13:
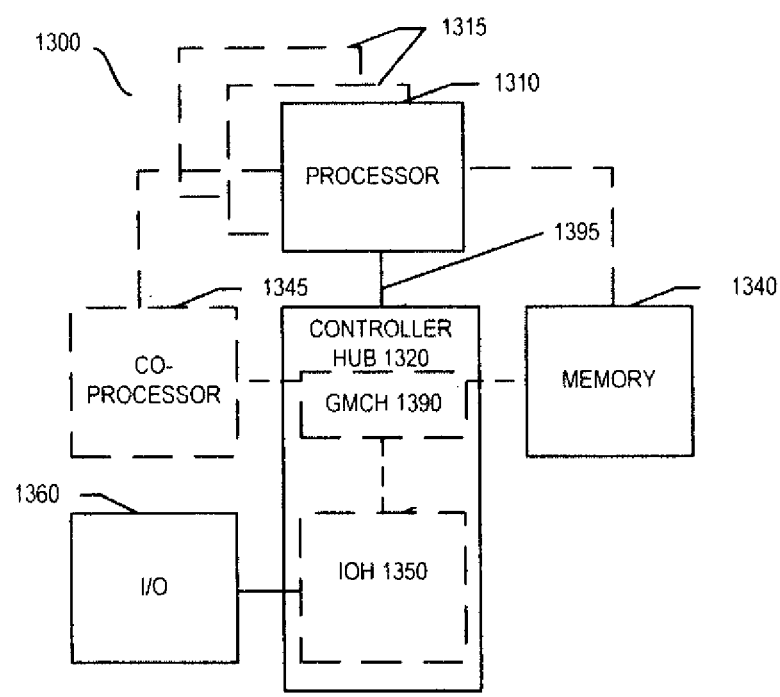
FIG. 13 shown is a block diagram of a system in accordance with one embodiment of the present invention.

Referring now to FIG. 13, shown is a block diagram of a system 1300 in accordance with one embodiment of the present invention. The system 1300 may include one or more processors 1310, 1315, which are coupled to a controller hub 1320. In one embodiment the controller hub 1320 includes a graphics memory controller hub (GMCH) 1390 and an Input/Output Hub (IOH) 1350 (which may be on separate chips); the GMCH 1390 includes memory and graphics controllers to which are coupled memory 1340 and a coprocessor 1345; the IOH 1350 is couples input/output (I/O) devices 1360 to the GMCH 1390. Alternatively, one or both of the memory and graphics controllers are integrated within the processor (as described herein), the memory 1340 and the coprocessor 1345 are coupled directly to the processor 1310, and the controller hub 1320 in a single chip with the IOH 1350.

The optional nature of additional processors 1315 is denoted in FIG. 13 with broken lines. Each processor 1310, 1315 may include one or more of the processing cores described herein and may be some version of the processor 1200.

The memory 1340 may be, for example, dynamic random access memory (DRAM), phase change memory (PCM), or a combination of the two. For at least one embodiment, the controller hub 1320 communicates with the processor(s) 1310, 1315 via a multi-drop bus, such as a frontside bus (FSB), point-to-point interface such as QuickPath Interconnect (QPI), or similar connection 1395.

In one embodiment, the coprocessor 1345 is a special-purpose processor, such as, for example, a high-throughput MIC processor, a network or communication processor, compression engine, graphics processor, GPGPU, embedded processor, or the like. In one embodiment, controller hub 1320 may include an integrated graphics accelerator.

There can be a variety of differences between the physical resources 1310, 1315 in terms of a spectrum of metrics of merit including architectural, microarchitectural, thermal, power consumption characteristics, and the like.

In one embodiment, the processor 1310 executes instructions that control data processing operations of a general type. Embedded within the instructions may be coprocessor instructions. The processor 1310 recognizes these coprocessor instructions as being of a type that should be executed by the attached coprocessor 1345. Accordingly, the processor 1310 issues these coprocessor instructions (or control signals representing coprocessor instructions) on a coprocessor bus or other interconnect, to coprocessor 1345. Coprocessor(s) 1345 accept and execute the received coprocessor instructions.

Figure 14:
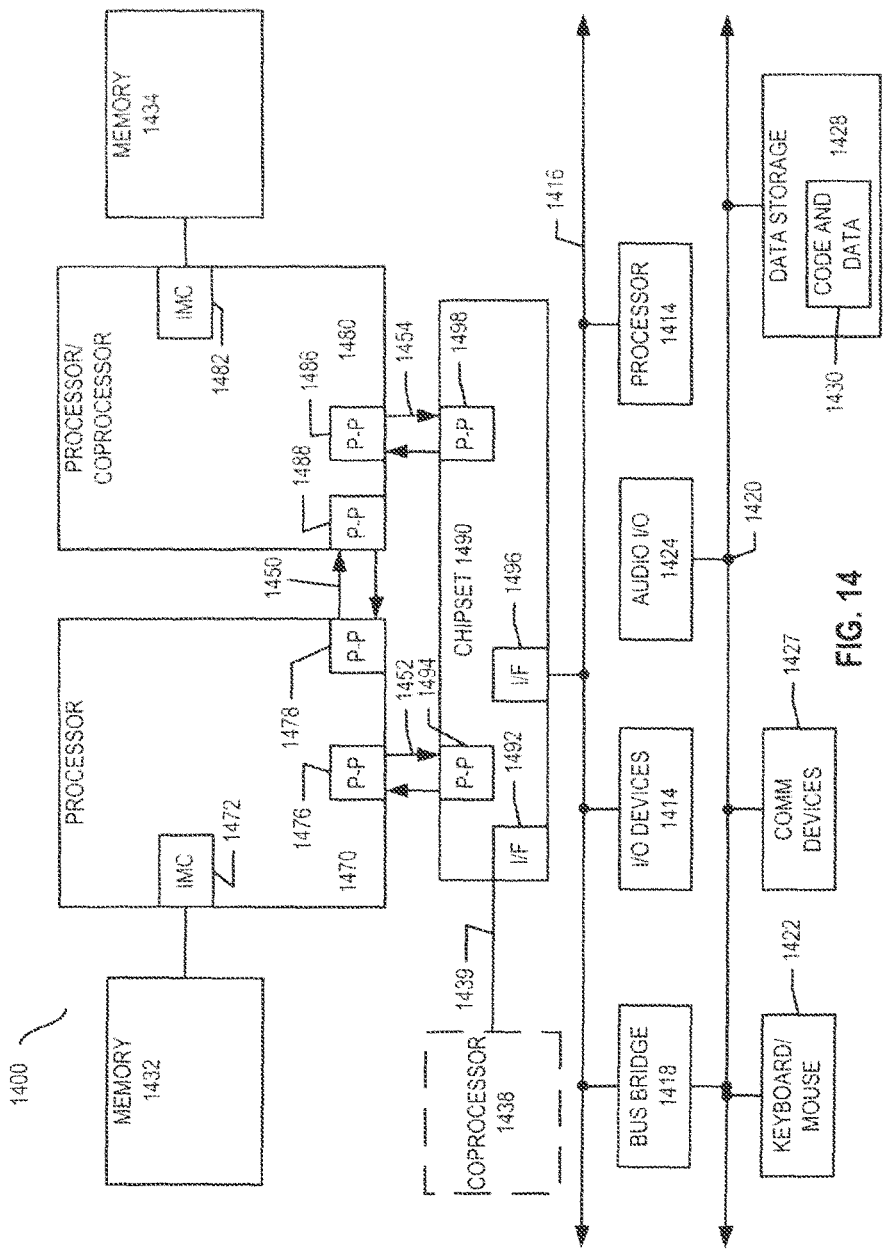
FIG. 14 shown is a block diagram of a first more specific exemplary system in accordance with an embodiment of the present invention.

Referring now to FIG. 14, shown is a block diagram of a first more specific exemplary system 1400 in accordance with an embodiment of the present invention. As shown in FIG. 14, multiprocessor system 1400 is a point-to-point interconnect system, and includes a first processor 1470 and a second processor 1480 coupled via a point-to-point interconnect 1450. Each of processors 1470 and 1480 may be some version of the processor 1200. In one embodiment of the invention, processors 1470 and 1480 are respectively processors 1310 and 1315, while coprocessor 1438 is coprocessor 1345. In another embodiment, processors 1470 and 1480 are respectively processor 1310 coprocessor 1345.

Processors 1470 and 1480 are shown including integrated memory controller (IMC) units 1472 and 1482, respectively. Processor 1470 also includes as part of its bus controller units point-to-point (P-P) interfaces 1476 and 1478; similarly, second processor 1480 includes P-P interfaces 1486 and 1488. Processors 1470, 1480 may exchange information via a point-to-point (P-P) interface 1450 using P-P interface circuits 1478, 1488. As shown in FIG. 14, IMCs 1472 and 1482 couple the processors to respective memories, namely a memory 1432 and a memory 1434, which may be portions of main memory locally attached to the respective processors.

Processors 1470, 1480 may each exchange information with a chipset 1490 via individual P-P interfaces 1452, 1454 using point to point interface circuits 1476, 1494, 1486, 1498. Chipset 1490 may optionally exchange information with the coprocessor 1438 via a high-performance interface 1439. In one embodiment, the coprocessor 1438 is a special-purpose processor, such as, for example, a high-throughput MIC processor, a network or communication processor, compression engine, graphics processor, GPGPU, embedded processor, or the like.

A shared cache (not shown) may be included in either processor or outside of both processors, yet connected with the processors via P-P interconnect, such that either or both processors' local cache information may be stored in the shared cache if a processor is placed into a low power mode.

Chipset 1490 may be coupled to a first bus 1416 via an interface 1496. In one embodiment, first bus 1416 may be a Peripheral Component Interconnect (PCI) bus, or a bus such as a PCI Express bus or another third generation I/O interconnect bus, although the scope of the present invention is not so limited.

As shown in FIG. 14, various I/O devices 1414 may be coupled to first bus 1416, along with a bus bridge 1418 which couples first bus 1416 to a second bus 1420. In one embodiment, one or more additional processor(s) 1415, such as coprocessors, high-throughput MIC processors, GPGPU's, accelerators (such as, e.g., graphics accelerators or digital signal processing (DSP) units), field programmable gate arrays, or any other processor, are coupled to first bus 1416. In one embodiment, second bus 1420 may be a low pin count (LPC) bus. Various devices may be coupled to a second bus 1420 including, for example, a keyboard and/or mouse 1422, communication devices 1427 and a storage unit 1428 such as a disk drive or other mass storage device which may include instructions/code and data 1430, in one embodiment. Further, an audio I/O 1424 may be coupled to the second bus 1420. Note that other architectures are possible. For example, instead of the point-to-point architecture of FIG. 14, a system may implement a multi-drop bus or other such architecture.

Figure 15:
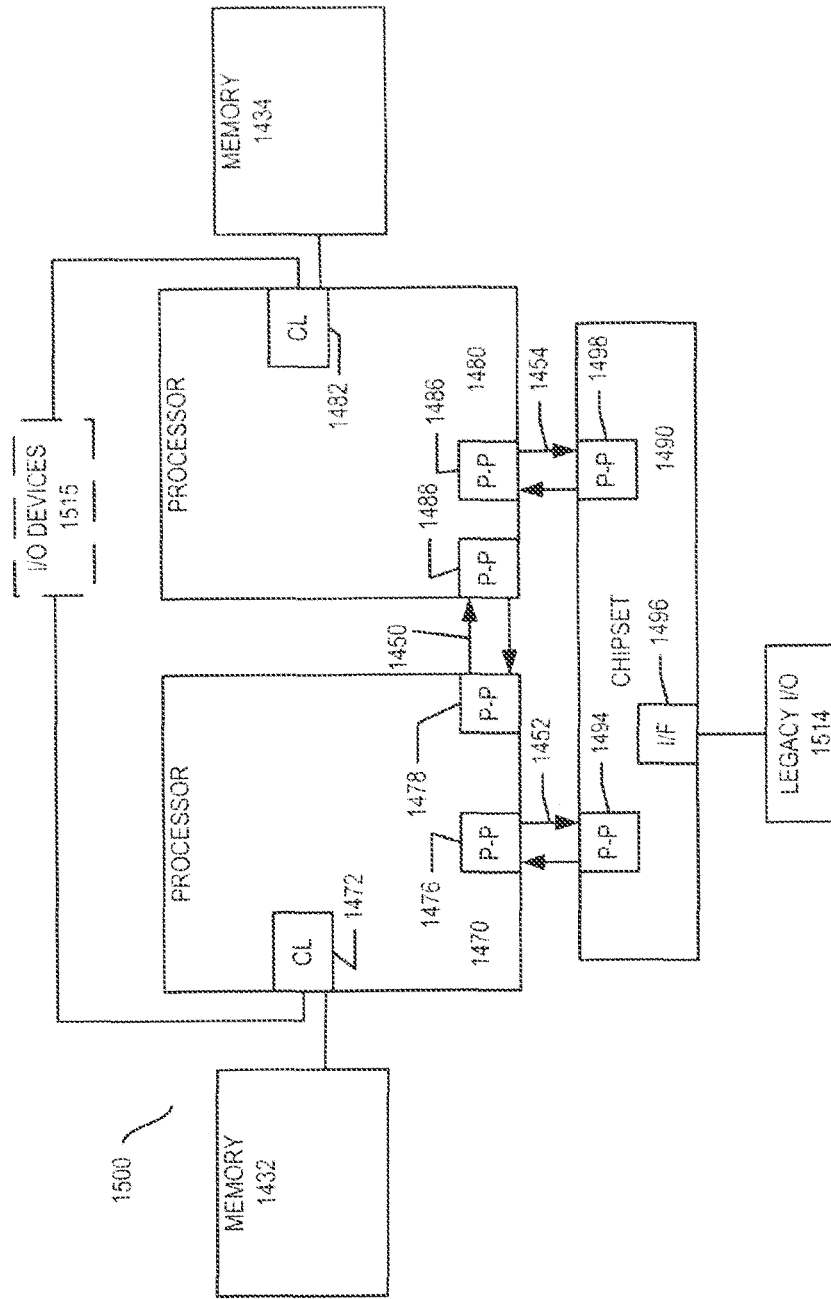
FIG. 15 shown is a block diagram of a second more specific exemplary system in accordance with an embodiment of the present invention.

Referring now to FIG. 15, shown is a block diagram of a second more specific exemplary system 1500 in accordance with an embodiment of the present invention. Like elements in FIGS. 14-15 bear like reference numerals, and certain aspects of FIG. 14 have been omitted from FIG. 15 in order to avoid obscuring other aspects of FIG. 15.

FIG. 15 illustrates that the processors 1470, 1480 may include integrated memory and I/O control logic ("CL") 1472 and 1482, respectively. Thus, the CL 1472, 1482 include integrated memory controller units and include I/O control logic. FIG. 15 illustrates that not only are the memories 1432, 1434 coupled to the CL 1472, 1482, but also that I/O devices 1514 are also coupled to the control logic 1472, 1482. Legacy I/O devices 1515 are coupled to the chipset 1490.

Figure 16:
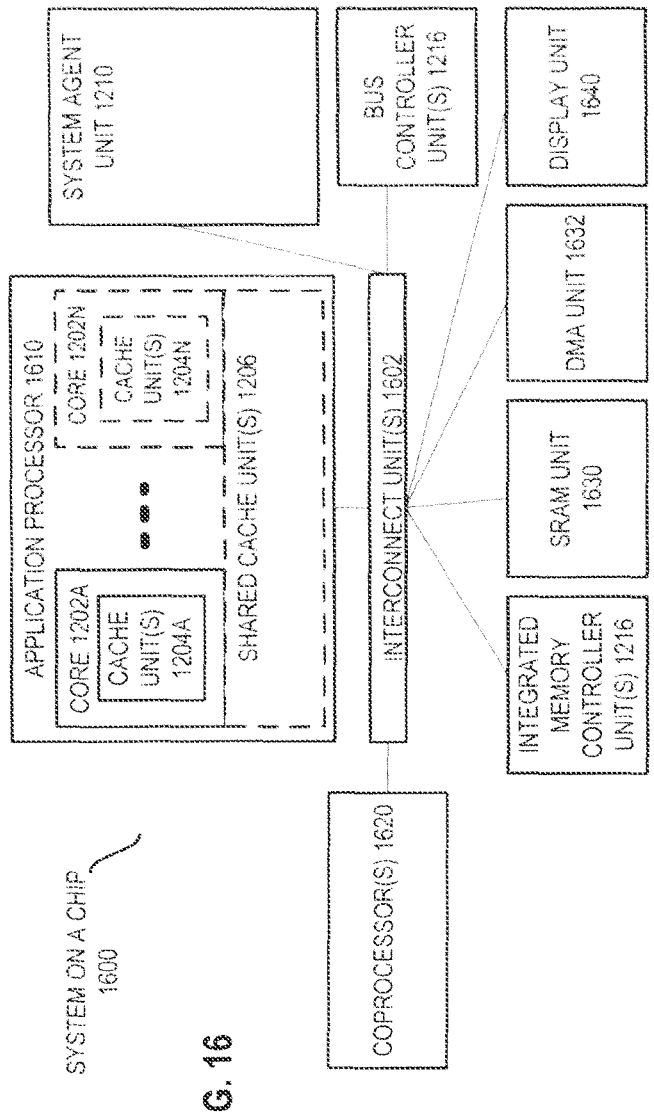
FIG. 16 shown is a block diagram of a SoC in accordance with an embodiment of the present invention.

Referring now to FIG. 16, shown is a block diagram of a SoC 1600 in accordance with an embodiment of the present invention. Similar elements in FIG. 12 bear like reference numerals. Also, dashed lined boxes are optional features on more advanced SoCs. In FIG. 16, an interconnect unit(s) 1602 is coupled to: an application processor 1610 which includes a set of one or more cores 202A-N and shared cache unit(s) 1206; a system agent unit 1210; a bus controller unit(s) 1216; an integrated memory controller unit(s) 1214; a set or one or more coprocessors 1620 which may include integrated graphics logic, an image processor, an audio processor, and a video processor; an static random access memory (SRAM) unit 1630; a direct memory access (DMA) unit 1632; and a display unit 1640 for coupling to one or more external displays. In one embodiment, the coprocessor(s) 1620 include a special-purpose processor, such as, for example, a network or communication processor, compression engine, GPGPU, a high-throughput MIC processor, embedded processor, or the like.

Embodiments of the mechanisms disclosed herein may be implemented in hardware, software, firmware, or a combination of such implementation approaches. Embodiments of the invention may be implemented as computer programs or program code executing on programmable systems comprising at least one processor, a storage system (including volatile and non-volatile memory and/or storage elements), at least one input device, and at least one output device.

Program code, such as code 1430 illustrated in FIG. 14, may be applied to input instructions to perform the functions described herein and generate output information. The output information may be applied to one or more output devices, in known fashion. For purposes of this application, a processing system includes any system that has a processor, such as, for example; a digital signal processor (DSP), a microcontroller, an application specific integrated circuit (ASIC), or a microprocessor.

The program code may be implemented in a high level procedural or object oriented programming language to communicate with a processing system. The program code may also be implemented in assembly or machine language, if desired. In fact, the mechanisms described herein are not limited in scope to any particular programming language. In any case, the language may be a compiled or interpreted language.

One or more aspects of at least one embodiment may be implemented by representative instructions stored on a machine-readable medium which represents various logic within the processor, which when read by a machine causes the machine to fabricate logic to perform the techniques described herein. Such representations, known as "IP cores" may be stored on a tangible, machine readable medium and supplied to various customers or manufacturing facilities to load into the fabrication machines that actually make the logic or processor.

Such machine-readable storage media may include, without limitation, non-transitory, tangible arrangements of articles manufactured or formed by a machine or device, including storage media such as hard disks, any other type of disk including floppy disks, optical disks, compact disk read-only memories (CD-ROMs), compact disk rewritable's (CD-RWs), and magneto-optical disks, semiconductor devices such as read-only memories (ROMs), random access memories (RAMs) such as dynamic random access memories (DRAMs), static random access memories (SRAMs), erasable programmable read-only memories (EPROMs), flash memories, electrically erasable programmable read-only memories (EEPROMs), phase change memory (PCM), magnetic or optical cards, or any other type of media suitable for storing electronic instructions.

Accordingly, embodiments of the invention also include non-transitory, tangible machine-readable media containing instructions or containing design data, such as Hardware Description Language (HDL), which defines structures, circuits, apparatuses, processors and/or system features described herein. Such embodiments may also be referred to as program products.

Emulation (Including Binary Translation, Code Morphing, etc.)

In some cases, an instruction converter may be used to convert an instruction from a source instruction set to a target instruction set. For example, the instruction converter may translate (e.g., using static binary translation, dynamic binary translation including dynamic compilation), morph, emulate, or otherwise convert an instruction to one or more other instructions to be processed by the core. The instruction converter may be implemented in software, hardware, firmware, or a combination thereof. The instruction converter may be on processor, off processor, or part on and part off processor.

Figure 17:
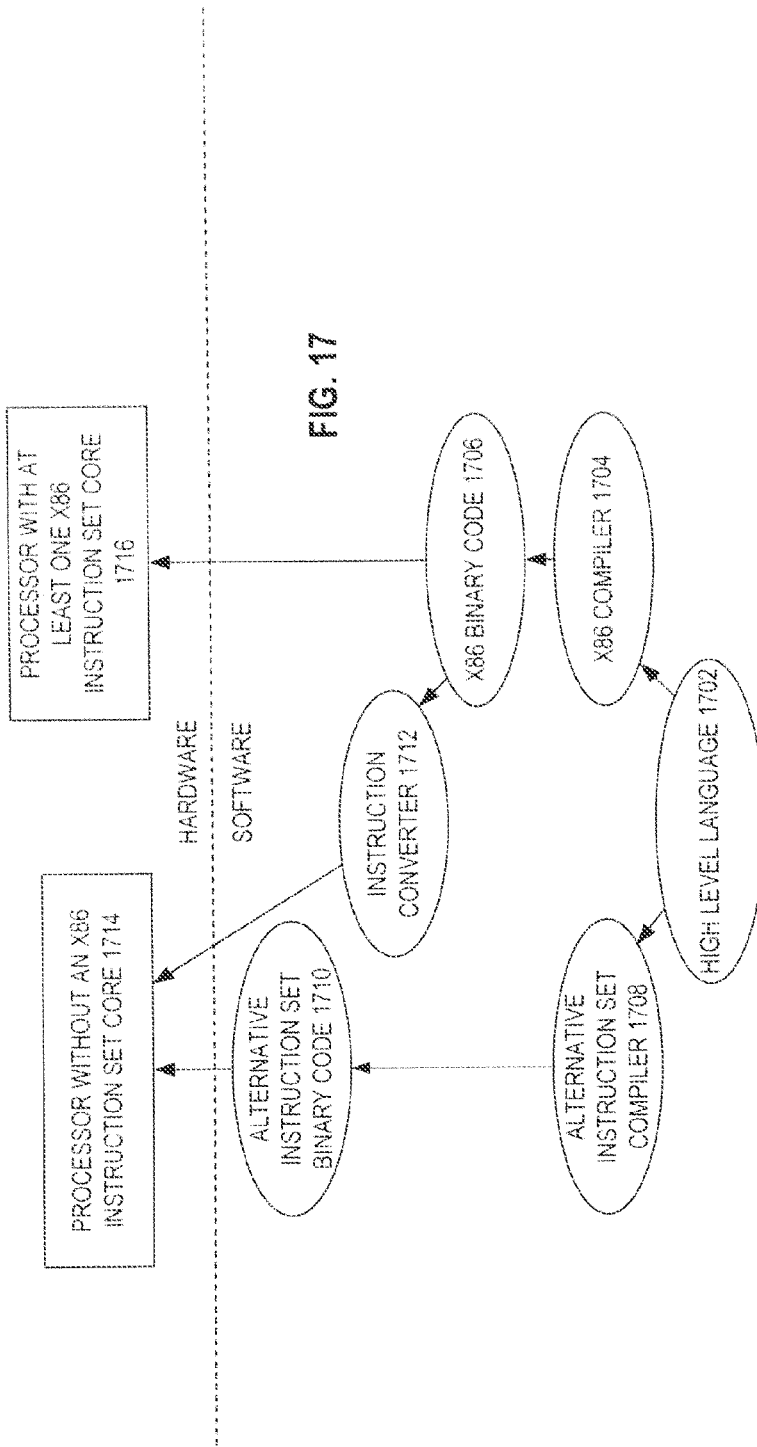
FIG. 17 is a block diagram contrasting the use of a software instruction converter to convert binary instructions in a source instruction set to binary instructions in a target instruction set according to embodiments of the invention.

FIG. 17 is a block diagram contrasting the use of a software instruction converter to convert binary instructions in a source instruction set to binary instructions in a target instruction set according to embodiments of the invention. In the illustrated embodiment, the instruction converter is a software instruction converter, although alternatively the instruction converter may be implemented in software, firmware, hardware, or various combinations thereof. FIG. 17 shows a program in a high level language 1702 may be compiled using an x86 compiler 1704 to generate x86 binary code 1706 that may be natively executed by a processor with at least one x86 instruction set core 1716. The processor with at least one x86 instruction set core 1716 represents any processor that can perform substantially the same functions as an Intel processor with at least one x86 instruction set core by compatibly executing or otherwise processing (1) a substantial portion of the instruction set of the Intel x86 instruction set core or (2) object code versions of applications or other software targeted to run on an Intel processor with at least one x86 instruction set core, in order to achieve substantially the same result as an Intel processor with at least one x86 instruction set core. The x86 compiler 1704 represents a compiler that is operable to generate x86 binary code 1706 (e.g., object code) that can, with or without additional linkage processing, be executed on the processor with at least one x86 instruction set core 1716. Similarly, FIG. 17 shows the program in the high level language 1702 may be compiled using an alternative instruction set compiler 1708 to generate alternative instruction set binary code 1710 that may be natively executed by a processor without at least one x86 instruction set core 1714 (e.g., a processor with cores that execute the MIPS instruction set of MIPS Technologies of Sunnyvale, Calif. and/or that execute the ARM instruction set of ARM Holdings of Sunnyvale, Calif.). The instruction converter 1712 is used to convert the x86 binary code 1706 into code that may be natively executed by the processor without an x86 instruction set core 1714. This converted code is not likely to be the same as the alternative instruction set binary code 1710 because an instruction converter capable of this is difficult to make; however, the converted code will accomplish the general operation and be made up of instructions from the alternative instruction set. Thus, the instruction converter 1712 represents software, firmware, hardware, or a combination thereof that, through emulation, simulation or any other process, allows a processor or other electronic device that does not have an x86 instruction set processor or core to execute the x86 binary code 1706.

Components, features, and details described for any of FIGS. 3-4 may also optionally be used in any of FIGS. 1-2. Components, features, and details described for any of FIGS. 5-9 may also optionally be used in any of FIGS. 1-4. Moreover, components, features, and details described herein for any of the processors or instruction processing apparatus may also optionally be used in any of the methods described herein, which in embodiments may be performed by and/or with such processors or apparatus.

In the description and claims, the terms "coupled" and/or "connected," along with their derivatives, have be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still co-operate or interact with each other. For example, a memory access unit may be coupled with a set of registers and/or a decode unit through one or more intervening components. In the figures, arrows are used to show couplings.

In the description and claims, the term "logic" may have been used. As used herein, logic may include hardware, firmware, software, or various combinations thereof. Examples of logic include integrated circuitry, application specific integrated circuits, analog circuits, digital circuits, programmed logic devices, memory devices including instructions, etc. In some embodiments, hardware logic may include transistors and/or gates potentially along with other circuitry components.

In the description above, specific details have been set forth in order to provide a thorough understanding of the embodiments. However, other embodiments may be practiced without some of these specific details. The scope of the invention is not to be determined by the specific examples provided above but only by the claims below. In other instances, well-known circuits, structures, devices, and operations have been shown in block diagram form or without detail in order to avoid obscuring the understanding of the description. Where multiple components have been shown and described, in some cases these multiple components may be incorporated into one component. Where a single component has been shown and described, in some cases this single component may be separated into two or more components.

Various operations and methods have been described. Some of the methods have been described in a relatively basic form in the flow diagrams, but operations may optionally be added to and/or removed from the methods. In addition, while the flow diagrams show a particular order of the operations according to example embodiments, that particular order is exemplary. Alternate embodiments may optionally perform the operations in different order, combine certain operations, overlap certain operations, etc.

Certain operations may be performed by hardware components, or may be embodied in machine-executable or circuit-executable instructions, that may be used to cause and/or result in a machine, circuit, or hardware component (e.g., a processor, potion of a processor, circuit, etc.) programmed with the instructions performing the operations. The operations may also optionally be performed by a combination of hardware and software. A processor, machine, circuit, or hardware may include specific or particular circuitry or other logic (e.g., hardware potentially combined with firmware and/or software) is operable to execute and/or process the instruction and store a result in response to the instruction.

Some embodiments include an article of manufacture (e.g., a computer program product) that includes a machine-readable medium. The medium may include a mechanism that provides, for example stores, information in a form that is readable by the machine. The machine-readable medium may provide, or have stored thereon, an instruction or sequence of instructions, that if and/or when executed by a machine are operable to cause the machine to perform and/or result in the machine performing one or operations, methods, or techniques disclosed herein. The machine-readable medium may provide, for example store, one or more of the embodiments of the instructions disclosed herein.

In some embodiments, the machine-readable medium may include a tangible and/or non-transitory machine-readable storage medium. For example, the tangible and/or non-transitory machine-readable storage medium may include a floppy diskette, an optical storage medium, an optical disk, an optical data storage device, a CD-ROM, a magnetic disk, a magneto-optical disk, a read only memory (ROM), a programmable ROM (PROM), an erasable-and-programmable ROM (EPROM), an electrically-erasable-and-programmable ROM (EEPROM), a random access memory (RAM), a static-RAM (SRAM), a dynamic-RAM (DRAM), a Flash memory, a phase-change memory, a phase-change data storage material, a non-volatile memory, a non-volatile data storage device, a non-transitory memory, a non-transitory data storage device, or the like. The non-transitory machine-readable storage medium does not consist of a transitory propagated signal. In another embodiment, the machine-readable medium may include a transitory machine-readable communication medium, for example, the electrical, optical, acoustical or other forms of propagated signals, such as carrier waves, infrared signals, digital signals, or the like.

Examples of suitable machines include, but are not limited to, general-purpose processors, special-purpose processors, instruction processing apparatus, digital logic circuits, integrated circuits, and the like. Still other examples of suitable machines include computing devices and other electronic devices that incorporate such processors, instruction processing apparatus, digital logic circuits, or integrated circuits. Examples of such computing devices and electronic devices include, but are not limited to, desktop computers, laptop computers, notebook computers, tablet computers, netbooks, smartphones, cellular phones, servers, network devices (e.g., routers and switches.), Mobile Internet devices (MIDs), media players, smart televisions, nettops, set-top boxes, and video game controllers.

Reference throughout this specification to "one embodiment," "an embodiment," "one or more embodiments," "some embodiments," for example, indicates that a particular feature may be included in the practice of the invention but is not necessarily required to be. Similarly, in the description various features are sometimes grouped together in a single embodiment, Figure, or description thereof for the purpose of streamlining the disclosure and aiding in the understanding of various inventive aspects. This method of disclosure, however, is not to be interpreted as reflecting an intention that the invention requires more features than are expressly recited in each claim. Rather, as the following claims reflect, inventive aspects lie in less than all features of a single disclosed embodiment. Thus, the claims following the Detailed Description are hereby expressly incorporated into this Detailed Description, with each claim standing on its own as a separate embodiment of the invention.

Example Embodiments

The following examples pertain to further embodiments. Specifics in the examples may be used anywhere in one or more embodiments.

Example 1 is a processor that includes a plurality of N-bit registers. The processor also includes a decode unit to receive a multiple register memory access instruction. The multiple register memory access instruction is to indicate a memory location and is to indicate a register. The processor also includes a memory access unit coupled with the decode unit and with the plurality of the N-bit registers. The memory access unit is to perform a multiple register memory access operation in response to the multiple register memory access instruction. The multiple register memory access operation is to involve N-bit data, in each of the plurality of the N-bit registers that are to comprise the indicated register. The multiple register memory access operation is also to involve different corresponding N-bit portions of an M×N-bit line of memory, that is to correspond to the indicated memory location. Optionally, a total number of bits of the N-bit data in the plurality of the N-bit registers to be involved in the multiple register memory access operation is to amount to at least half of the M×N-bits of the line of memory.

Example 2 includes the processor of Example 1 and optionally in which the memory access unit is to perform the operation in which the total number of bits of the N-bit data in the plurality of the N-bit registers to be involved in the multiple register memory access operation is to amount to all of the M×N-bits of the line of memory.

Example 3 includes the processor of Example 1 and optionally in which the memory access unit is to perform the operation in which the total number of bits of the N-bit data in the plurality of the N-bit registers to be involved in the multiple register memory access operation is to amount to at least 256-bits.

Example 4 includes the processor of Example 3 and optionally in which the memory access unit is to perform the operation in which the total number of bits of the N-bit data in the plurality of the N-bit registers to be involved in the multiple register memory access operation is to amount to at least 512-bits.

Example 5 includes the processor of any preceding example and optionally in which the memory access unit is to perform the operation that is to involve the N-bit data in each of at least three N-bit registers.

Example 6 includes the processor of any preceding example and optionally in which the memory access unit is to perform the operation that is to involve the N-bit data in each of at least four N-bit registers.

Example 7 includes the processor of Example 1 and optionally in which the memory access unit is to perform the operation that is to involve 128-bit data, in each of at least four 128-bit registers, and the different corresponding 128-bit portions of the line of memory that is to be at least 512-bits.

Example 8 includes the processor of Example 1 and optionally in which the memory access unit is to perform the operation that is to involve 256-bit data, in each of at least two 256-bit registers, and the different corresponding 256-bit portions of the line of memory that is to be at least 512-bits.

Example 9 includes the processor of any of Examples 1-8 and optionally in which the processor includes a reduced instruction set computing (RISC) processor, and in which the multiple register memory access instruction includes a multiple register load from memory instruction, and in which the memory access unit is to load the different N-bit portions of the M×N-bit line of memory in each of the plurality of the N-bit registers, in response to the multiple register load from memory instruction. Optionally, the total number of bits of the different N-bit portions to be loaded in the plurality of the N-bit registers from the M×N-bit line of memory is to amount to at least half of the M×N-bits of the line of memory.

Example 10 includes the processor of Example 9 and optionally in which the memory access unit is to load different 128-bit portions of the line of memory which is at least 512-bits in each of at least four 128-bit registers.

Example 11 includes the processor of Example 9 and optionally in which the memory access unit is to load different 256-bit portions of the line of memory which is at least 512-bits in each of at least two 256-bit registers.

Example 12 includes the processor of any of Example 1-8 and optionally in which the processor includes a reduced instruction set computing (RISC) processor, and in which the multiple register memory access instruction includes a multiple register write to memory instruction, and in which the memory access unit is to write the N-bit data, from each of the plurality of the N-bit registers, to the different corresponding N-bit portions of the M×N-bit line of memory, in response to the multiple register write to memory instruction. Optionally, the total number of bits of the N-bit data to be written from the plurality of the N-bit registers to the M×N-bit line of memory is to amount to at least half of the M×N-bits of the line of memory. Optionally, the at least half of the M×N-bits of the line of memory is at least 256-bits.

Example 13 includes the processor of any of Example 1-8 and optionally in which the multiple register memory access instruction is to explicitly specify each of the plurality of registers.

Example 14 includes the processor of any of Example 1-8 and optionally in which the multiple register memory access instruction is to specify a number of the plurality of registers.

Example 15 is a method performed by a processor that includes receiving a multiple register memory access instruction. The multiple register memory access instruction indicates a memory location and indicating a register. The method includes performing a multiple register memory access operation in response to the multiple register memory access instruction. The operation involves N-bit data, in each of a plurality of N-bit registers that comprise the indicated register. The operation also involves different corresponding N-bit portions of an M×N-bit line of memory, corresponding to the indicated memory location. Optionally, a total number of bits of the N-bit data in the plurality of the N-bit registers involved in the multiple register memory access operation amounts to at least half of the M×N-bits of the line of memory.

Example 16 includes the method of Example 15 and optionally in which the total number of bits of the N-bit data in the plurality of the N-bit registers involved in the multiple register memory access operation amounts to all of the M×N-bits of the line of memory.

Example 17 includes the method of Example 15 and optionally in which the total number of bits of the N-bit data in the plurality of the N-bit registers involved in the multiple register memory access operation amounts to at least 256-bits.

Example 18 includes the method of any preceding example and optionally in which performing includes performing the operation involving the N-bit data in each of at least four N-bit registers.

Example 19 includes the method of Example 15 and optionally in which performing includes performing the operation involving 128-bit data, in each of at least four 128-bit registers, and the different corresponding 128-bit portions of the line of memory which is at least 512-bits.

Example 20 includes the method of Example 15 and optionally in which performing includes performing the operation involving 256-bit data, in each of at least two 256-bit registers, and the different corresponding 256-bit portions of the line of memory which is at least 512-bits.

Example 21 includes the method of any of Examples 15-20 and optionally in which receiving includes receiving a multiple register load from memory instruction, and in which performing includes loading the different N-bit portions of the M×N-bit line of memory in each of the plurality of the N-bit registers, in response to the multiple register load from memory instruction. Optionally, the total number of bits of the different N-bit portions loaded in the plurality of the N-bit registers from the M×N-bit line of memory amounts to at least half of the M×N-bits of the line of memory.

Example 22 includes the method of Example 21 and optionally in which performing includes loading different 128-bit portions of the line of memory which is at least 512-bits in each of at least four 128-bit registers.

Example 23 includes the method of Example 21 and optionally in which performing includes loading different 256-bit portions of the line of memory which is at least 512-bits in each of at least two 256-bit registers.

Example 24 includes the method of any of Examples 15-20 and optionally in which receiving includes receiving a multiple register write to memory instruction, and in which performing includes writing the N-bit data, from each of the plurality of the N-bit registers, to the different corresponding N-bit portions of the M×N-bit line of memory, in response to the multiple register write to memory instruction. Optionally, the total number of bits of the N-bit data written from the plurality of the N-bit registers to the M×N-bit line of memory amounts to at least half of the M×N-bits of the line of memory. Optionally, the at least half of the M×N-bits of the line of memory is at least 256-bits.

Example 25 is a system to process instructions that includes an interconnect, a dynamic random access memory (DRAM) coupled with the interconnect, and a processor coupled with the interconnect. The processor, in response to a multiple register memory access instruction that is to indicate a memory location in the DRAM and a register, is to perform a multiple register memory access operation. The operation is to involve N-bit data, in each of a plurality of N-bit registers of the processor that are to comprise the indicated register. The operation is also to involve different corresponding N-bit portions of an M×N-bit line of the DRAM that is to correspond to the indicated memory location. Optionally, a total number of bits of the N-bit data in the plurality of the N-bit registers to be involved in the multiple register memory access operation is to amount to at least half of the M×N-bits of the line of memory.

Example 26 includes the system of Example 25 and optionally in which the total number of bits of the N-bit data in the plurality of the N-bit registers to be involved in the multiple register memory access operation is to amount to all of the M×N-bits of the line of memory which is at least 512-bits.

Example 27 is an article of manufacture that includes a non-transitory machine-readable storage medium storing a multiple register memory access instruction. The multiple register memory access instruction is to indicate a memory location and a register. The multiple register memory access instruction if processed by a machine is operable to cause the machine to perform operations including performing a multiple register memory access operation involving N-bit data, in each of a plurality of N-bit registers that are to comprise the indicated register. The operation is also to involve different corresponding N-bit portions of an M×N-bit line of memory, that is to correspond to the indicated memory location. Optionally, a total number of bits of the N-bit data in the plurality of the N-bit registers involved in the multiple register memory access operation amounts to at least half of the M×N-bits of the line of memory.

Example 28 includes the article of manufacture of Example 27 and optionally in which the total number of bits of the N-bit data in the plurality of the N-bit registers to be involved in the multiple register memory access operation is to amount to all of the M×N-bits of the line of memory which is at least 512-bits.

Example 29 is a processor that includes means for receiving a multiple register memory access instruction. The multiple register memory access instruction is to indicate a memory location and indicating a register. The processor also includes means for performing a multiple register memory access operation in response to the multiple register memory access instruction. The operation is to involve N-bit data, in each of a plurality of N-bit registers that comprise the indicated register. The operation also is to involve different corresponding N-bit portions of an M×N-bit line of memory, corresponding to the indicated memory location. Optionally, a total number of bits of the N-bit data in the plurality of the N-bit registers involved in the multiple register memory access operation amounts to at least half of the M×N-bits of the line of memory.

Example 30 includes the processor of Example 29 and optionally in which the total number of bits of the N-bit data in the plurality of the N-bit registers involved in the multiple register memory access operation amounts to all of the M×N-bits of the line of memory.

Example 31 is a machine-readable storage medium storing an instruction that if executed by a machine is to cause the machine to perform the method of any of Examples 15-24.

Example 32 is a processor to perform the method of any of Examples 15-24.

Example 33 is a processor including means for performing the method of any of Examples 15-24.

Example 34 is a processor including integrated circuitry and/or logic and/or units and/or components and/or modules, or any combination thereof, to perform the methods of any of Examples 15-24.

Example 35 is a computer system including a processor and optionally including a dynamic random access memory (DRAM), the computer system to perform the method of any of Examples 15-24.

Example 36 is a processor to perform a method or operation substantially as described herein.

Example 37 is a processor including means for performing a method or operation substantially as described herein.

Example 38 is a processor to execute an instruction substantially as described herein.

Example 39 is a processor including means for performing operations of an instruction substantially as described herein.

What is claimed is:

1. A system on a chip (SoC) comprising:
   an integrated memory controller; and
   a processor coupled to the integrated memory controller, the processor comprising:
      a cache to store a plurality of cache lines;
      a plurality of general purpose registers;
      a plurality of 128-bit packed data registers, including a first source 128-bit packed data register, and a second source 128-bit packed data register;
      an instruction fetch unit to fetch instructions, including a store to memory instruction;
      a decode unit to decode the store to memory instruction, the store to memory instruction having a first field to specify the first source 128-bit packed data register, having a second field to specify the second source 128-bit packed data register, and indicating a starting memory location in a memory at which to store data; and
      a memory access unit coupled to the decode unit, and coupled to the plurality of 128-bit packed data registers, the memory access unit to perform a store to memory operation, in response to the decoded store to memory instruction, the store to memory operation to:
         store a first 128-bit data from the first source 128-bit packed data register to the memory starting at the indicated starting memory location; and
         store a second 128-bit data from the second source 128-bit packed data register to the memory at a location adjacently after the first 128-bit data.

2. The SoC of claim 1, further comprising a plurality of write mask registers to predicate result vector writes.

3. The SoC of claim 1, further comprising a 16-wide vector processing unit to execute double-precision float instructions.

4. The SoC of claim 1, wherein the cache is to store 512-bit cache lines.

5. The SoC of claim 1, wherein the cache is to store 1024-bit cache lines.

6. The SoC of claim 1, wherein the cache is to store cache lines that are a multiple of a width of the 128-bit packed data registers.

7. The SoC of claim 1, further comprising:
   a branch prediction unit; and
   a translation lookaside buffer (TLB).

8. The SoC of claim 1, wherein the processor is a reduced instruction set computing (RISC) processor.

9. The SoC of claim 1, further comprising a communication processor coupled to the processor.

10. The SoC of claim 1, further comprising a network processor coupled to the processor.

11. The SoC of claim 1, further comprising an image processor coupled to the processor.

12. The SoC of claim 1, further comprising a display unit coupled to the processor, the display unit to couple an external display.

13. The SoC of claim 1, further comprising a graphics processing unit coupled to the processor.

14. The SoC of claim 1, further comprising an audio processor coupled to the processor.

15. The SoC of claim 1, further comprising an interconnect coupled to the processor and the integrated memory controller.

16. The SoC of claim 15, wherein the interconnect comprises a ring interconnect.

17. The SoC of claim 1, further comprising a direct memory access (DMA) unit coupled to the processor.

18. The SoC of claim 1, further comprising a coprocessor coupled to the processor.

19. A method performed by a system on a chip (SoC), the method comprising:
   loading a plurality of cache lines from a memory with an integrated memory controller of the SoC;
   storing the plurality of cache lines in a cache of a processor of the SoC;
   storing data in a plurality of general purpose registers of the processor;
   storing a first 128-bit data in a first source 128-bit packed data register of the processor;
   storing a second 128-bit data in a second source 128-bit packed data register of the processor;
   fetching a store to memory instruction with an instruction fetch unit of the processor;
   decoding the store to memory instruction with a decode unit of the processor, the store to memory instruction having a first field specifying the first source 128-bit packed data register, having a second field specifying the second source 128-bit packed data register, and indicating a starting memory location in a memory at which to store data; and performing a store to memory operation, in response to the decoded store to memory instruction, the store to memory operation including:
  storing the first 128-bit data from the first source 128-bit packed data register to the memory starting at the indicated starting memory location; and
  storing the second 128-bit data from the second source 128-bit packed data register to the memory at a location adjacently after the first 128-bit data.

20. An article of manufacture comprising a non-transitory machine-readable storage medium, the non-transitory machine-readable storage medium storing a set of instructions, including a store to memory instruction, the set of instructions if processed by a system on a chip (SoC) to cause the SoC to perform operations comprising to:
  load a plurality of cache lines from a memory with an integrated memory controller of the SoC;
  store the plurality of cache lines in a cache of a processor of the SoC;
  store data in a plurality of general purpose registers of the processor;
  store a first 128-bit data in a first source 128-bit packed data register of the processor; and
  store a second 128-bit data in a second source 128-bit packed data register of the processor; and
  the store to memory instruction if processed by the SoC to cause the SoC to perform operations comprising to:
  decode the store to memory instruction with a decode unit of the processor, the store to memory instruction having a first field to specify the first source 128-bit packed data register, having a second field to specify the second source 128-bit packed data register, and to indicate a starting memory location in the memory at which to store data; and
  perform a store to memory operation, in response to the decoded store to memory instruction, the store to memory operation to:
  store the first 128-bit data from the first source 128-bit packed data register to the memory starting at the indicated starting memory location; and
  store the second 128-bit data from the second source 128-bit packed data register to the memory at a location adjacently after the first 128-bit data.

\* \* \* \* \*